US009506988B2

(12) United States Patent
Sejima et al.

(10) Patent No.: US 9,506,988 B2
(45) Date of Patent: Nov. 29, 2016

(54) CONDITION ESTIMATION DEVICE AND METHOD OF ESTIMATING CONDITION

(71) Applicant: GS Yuasa International Ltd., Kyoto-shi (JP)

(72) Inventors: Kenichi Sejima, Kyoto (JP); Masashi Nakamura, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 400 days.

(21) Appl. No.: 14/069,096

(22) Filed: Oct. 31, 2013

(65) Prior Publication Data

US 2014/0125345 A1 May 8, 2014

(30) Foreign Application Priority Data

| Nov. 5, 2012 | (JP) | 2012-243668 |
| Jan. 31, 2013 | (JP) | 2013-017152 |
| May 14, 2013 | (JP) | 2013-102179 |

(51) Int. Cl.
*G01N 27/416* (2006.01)
*G01R 31/36* (2006.01)

(52) U.S. Cl.
CPC ......... *G01R 31/362* (2013.01); *G01R 31/3648* (2013.01); *G01R 31/3658* (2013.01)

(58) Field of Classification Search
USPC ....................................................... 320/134
See application file for complete search history.

(56) References Cited

U.S. PATENT DOCUMENTS

| 6,307,351 B1 | 10/2001 | Yokoyama |
| 6,661,231 B1 | 12/2003 | Arai et al. |
| 7,663,374 B2 * | 2/2010 | Odaohhara ........ G01R 31/3648 320/132 |
| 7,714,531 B2 | 5/2010 | Kuranuki et al. |
| 8,200,444 B2 * | 6/2012 | Vaingast ............ G01R 31/3648 324/428 |
| 2002/0168574 A1 * | 11/2002 | Ahn ....................... H01M 4/139 429/232 |
| 2007/0202370 A1 | 8/2007 | Kuranuki et al. |
| 2009/0070052 A1 * | 3/2009 | Taniguchi .......... G01R 31/3651 702/63 |
| 2011/0012604 A1 | 1/2011 | Tsujiko et al. |

FOREIGN PATENT DOCUMENTS

| JP | 3397187 B2 | 4/2003 |
| JP | 2005-265801 A | 9/2005 |
| JP | 3817126 B2 | 8/2006 |
| JP | 3827709 B2 | 9/2006 |
| JP | 2007-166789 A | 6/2007 |
| JP | 2009-252381 A | 10/2009 |
| JP | 2010-133919 A | 6/2010 |
| JP | 2010-217070 A | 9/2010 |
| JP | 4561859 B2 | 10/2010 |
| JP | 2010-272365 A | 12/2010 |
| JP | 2013-019709 A | 1/2013 |

* cited by examiner

*Primary Examiner* — Yalkew Fantu
(74) *Attorney, Agent, or Firm* — McGinn IP Law Group, PLLC

(57) ABSTRACT

A condition estimation device for estimating condition of an electric storage device includes a voltage detector and a controller. The voltage detector is configured to detect a voltage of the electric storage device. The controller is configured to perform a distinctive point detection process to detect a distinctive point based on the voltage detected by the voltage detector, and an estimation process to estimate the condition of the electric storage device based on the distinctive point detected in the distinctive point detection process. The distinctive point is a point at which a variation in voltage per unit remaining capacity or per unit time of the electric storage device during charge or discharge is a local maximum value.

20 Claims, 20 Drawing Sheets

FIG.4

| VOLTAGE V<br>AT WHICH SECOND DISTINCTIVE<br>POINT P2 APPEARS | BATTERY CAPACITY X (Ah) |
|---|---|
| Va | Xa |
| Vb | Xb |
| Vc | Xc |
| Vd | Xd |
| Ve | Xe |

FIG.14

| PERIOD T (sec) | BATTERY CAPACITY X (Ah) |
|---|---|
| T1 | X1 |
| T2 | X2 |
| T3 | X3 |
| T4 | X4 |
| T5 | X5 |
| T6 | X6 |

FIG.20

| AMBIENT TEMPERATURE | PERIOD T | | | |
|---|---|---|---|---|
| | 100(sec) | 90(sec) | 80(sec) | 70(sec) |
| NORMAL TEMPERATURE | NEW BATTERY (CAPACITY RETENTION RATE 100%) | DETERIORATED BATTERY 1 (CAPACITY RETENTION RATE 90%) | DETERIORATED BATTERY 2 (CAPACITY RETENTION RATE 80%) | — |
| LOWER TEMPERATURE | — | NEW BATTERY (CAPACITY RETENTION RATE 100%) | DETERIORATED BATTERY 1 (CAPACITY RETENTION RATE 90%) | DETERIORATED BATTERY 2 (CAPACITY RETENTION RATE 80%) |

CONDITION ESTIMATION DEVICE AND METHOD OF ESTIMATING CONDITION

CROSS-REFERENCE TO RELATED APPLICATIONS

This application claims priority from Japanese Patent Applications No. 2012-243668 filed on Nov. 5, 2012, No. 2013-017152 filed on Jan. 31, 2013, and No. 2013-102179 filed on May 14, 2013. The entire content of the priority applications is incorporated herein by reference.

FIELD

The present invention relates to a technology for estimating a condition of an electric storage device, and a method of estimating a condition of an electric storage device.

BACKGROUND

Patent Document JP-A-2003-232839 discloses a technology for determining a capacity of a secondary battery based on calculation of a current accumulated from a predetermined fully discharged condition to a predetermined fully charged condition.

However, it may be difficult to charge the electric storage device in a predetermined fully discharged condition until the electric storage device satisfies a fully charged condition depending on how a device in which the electric storage device is installed is used. The electric storage device may not be fully charged until it satisfies a predetermined fully charged condition or fully discharged until it satisfies a predetermined fully discharged condition depending on how the device is used.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A technology disclosed herein is for estimating a condition of an electric storage device, such as a capacity of the electric storage device and an internal resistance, without discharging or charging the electric storage device until the electric storage device satisfies a predetermined fully charged condition or a predetermined fully discharged condition.

A condition estimation device for estimating condition of an electric storage device includes a voltage detector and a controller. The voltage detector is configured to detect a voltage of the electric storage device. The controller is configured to perform a distinctive point detection process to detect a distinctive point based on the voltage detected by the voltage detector, and an estimation process to estimate the condition of the electric storage device based on the distinctive point detected in the distinctive point detection process. The distinctive point is a point at which a variation in voltage per unit remaining capacity or per unit time of the electric storage device during charge or discharge is a local maximum value.

BRIEF DESCRIPTION OF DRAWINGS

The foregoing and other features of the present invention will become apparent from the following description and drawings of an illustrative embodiment of the invention in which:

FIG. 4 is a table including correlation data that represent a correlation between a voltage V at which a second distinctive point P2 appears and a battery capacity;

FIG. 14 is a table including correlation data that represent a correlation between periods and battery capacities;

FIG. 20 is a table including correlation data that represent a correlation between periods and battery deterioration levels (capacity retention) at different ambient temperatures according to an embodiment.

DESCRIPTION OF EMBODIMENTS

Figure 1:
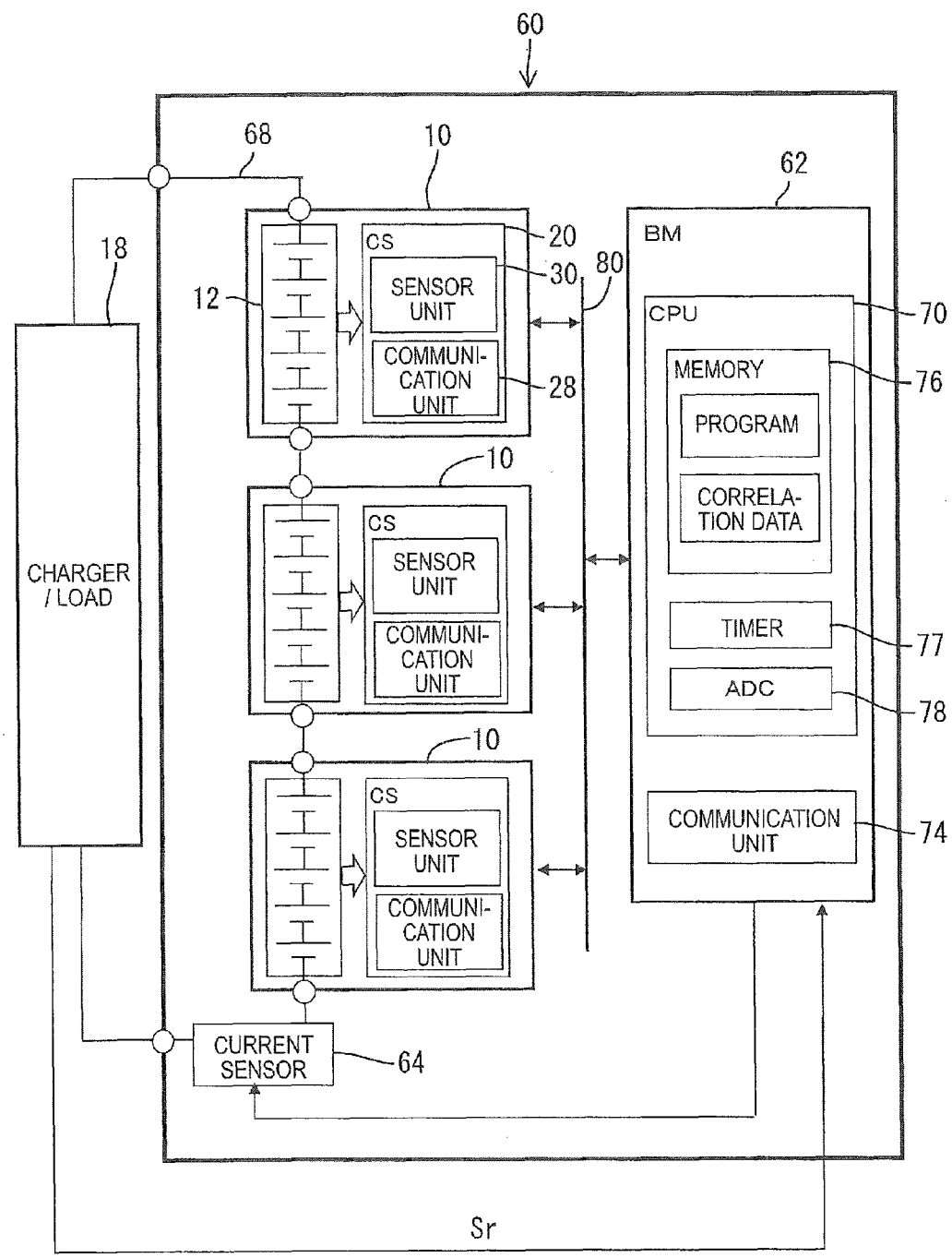
FIG. 1 is a schematic view illustrating a configuration of a battery pack according to an embodiment.

According to a first aspect, a condition estimation device for estimating condition of an electric storage device includes a voltage detector and a controller. The voltage detector is configured to detect a voltage of the electric storage device. The controller is configured to perform a distinctive point detection process to detect a distinctive point based on the voltage detected by the voltage detector, and an estimation process to estimate the condition of the electric storage device based on the distinctive point detected in the distinctive point detection process. The distinctive point is a point at which a variation in voltage per unit remaining capacity or per unit time of the electric storage device during charge or discharge is a local maximum value. The variations in voltage per unit remaining capacity or per unit time are variations in voltage per unit remaining capacity or per unit time.

According to a second aspect, the controller is configured to perform the estimation process to estimate the condition of the electric storage device based on the voltage of the electric storage device at which the distinctive point appears.

According to a third aspect, the controller is configured to perform the estimation process to estimate a remaining capacity of the electric storage device based on the distinctive point detected in the distinctive point detection process.

According to a fourth aspect, the distinctive point includes a plurality of distinctive points, and the controller is configured to select one of the distinctive points in a higher voltage region in the distinctive point detection process.

According to a fifth aspect, the controller is configured to perform a period measurement process to measure a period from when the distinctive point detected in the distinctive point detection process appears until when a voltage of the electric storage device reaches a set voltage, and perform the estimation process to estimate the condition of the electric storage device based on the period measured in the period measurement process.

According to a sixth aspect, the controller is configured to detect whether the voltage of the electric storage device reaches the set voltage based on the voltage of the electric storage device detected by the voltage detector.

According to a seventh aspect, the set voltage is a switching voltage at which a charge mode for charging the electric storage device is switched.

According to an eighth aspect, the controller is configured to perform the distinctive point detection process to determine the distinctive point based on the variation in voltage per unit remaining capacity or per unit time of the electric storage device during the charge.

According to a ninth aspect, the electric storage device includes a negative active material including graphite.

According to a tenth aspect, the controller is configured to perform a deterioration estimating process to estimate a deterioration level of the electric storage device.

According to an eleventh aspect, a condition estimation method for estimating condition of an electric storage includes detecting a distinctive point based on a voltage of the electric storage device detected by a voltage detector, and estimating the condition of the electric storage device based on the distinctive point. The distinctive point is a point at which a variation in voltage per unit remaining capacity or per unit time of the electric storage device during charge or discharge is a local maximum value.

The technologies described herein can be used in various applications including a condition estimation device, a method of estimating a condition, a computer program for executing the function of the device or the method, or a recording medium that stores the computer program.

According to the invention disclosed herein, the condition of the electric storage device can be estimated without charging or discharging the electric storage device until the electric storage device satisfies a predetermined fully charged condition or fully discharged condition, which was required in the known technology.

An embodiment of the present technology will be described in brief. In the condition estimation device, the controller is configured to estimate the condition of the electric storage device based on the distinctive point. The condition of the electric storage device can be estimated when the electric storage device is charged or discharged at least until the distinctive point appears. The condition estimation device according to this embodiment can estimate the condition of the electric storage device (e.g., the battery capacity or the internal resistance) without charging or discharging the electric storage device until the electric storage device satisfies a predetermined fully charged condition or fully discharged condition, which was required in the known technology. As a result, time required for the estimation of condition of the electric storage device can be shortened. In addition, the controller can estimate the condition more frequently, because requirements for the estimation of the condition are reduced.

In the condition estimation device, the controller is configured to estimate the condition of the electric storage device based on the voltage of the electric storage device at which the distinctive point appears. In this configuration, after the distinctive point appears, the electric storage device is not required to be charged or discharged for estimating the condition. Therefore, the time required for estimating the condition can be shortened, and thus requirements for the estimation of the condition can be reduced.

In the condition estimation device, the controller is configured to estimate the condition of the electric storage device based on a remaining capacity of the electric storage device at which the distinctive point appears. In this configuration, the condition of the electric storage devices that have different battery capacities can be estimated with high accuracy, and thus the requirements for the estimation of the condition can be reduced.

In the condition estimation device, the distinctive point includes a plurality of distinctive points, and the controller is configured to select one of the distinctive points in a higher voltage region in the distinctive point detection process. The points at which the distinctive points appear are not much different from one another in the high voltage region compared with the distinctive points in the lower voltage region. Therefore, the voltage at which the distinctive point appears and the period can be measured with high accuracy, and thus the condition of the electric storage device can be estimated with high accuracy.

In the condition estimation device, the condition of the electric storage device is estimated based on the period from when the distinctive point detected in the distinctive point detection process appears until when the voltage of the electric storage device reaches a set voltage. The period can be determined by measuring the time the voltage at which the distinctive point appears or the voltage slightly lower the voltage at which the distinctive point appears takes to reach the set voltage. Therefore, the controller can estimate the condition of the electric storage device without charging or discharging the electric storage device until the electric storage device satisfies a predetermined fully charged condition or a fully discharged condition, which was required in the known technology.

In the condition estimation device, the controller is configured to determine the distinctive point based on the variation in voltage per unit remaining capacity or per unit time of the electric storage device during the charge. Since the charge current is controlled by a charger, the charge current is more stable than the discharge current supplied to the load. Accordingly, the distinctive point can be easily detected.

In the condition estimation device, the controller is configured to detect whether the voltage of the electric storage device reaches the set voltage based on the voltage of the electric storage device detected by the voltage detector. In this configuration, the period from when the distinctive point appears until when the voltage of the electric device reaches the set voltage can be measured based on information including the value detected by the voltage detector and the time. Other measurement values are not required.

In the condition estimation device, the set voltage is a switching voltage at which a charge mode for charging the electric storage device is switched. The switching voltage can be detected by the charger. If the charger is configured to transmit a switching signal when the charge mode is switched, the condition estimation device is not required to determine whether the electric storage device has reached the set voltage. A processing load on the condition estimation device can be reduced.

First Embodiment

A first embodiment will be described with reference to FIG. 1 to FIG. 12.

1. Configuration of a Battery Pack

A configuration of a battery pack 60 according to this embodiment is illustrated in FIG. 1. The battery pack 60 is installed in an electric vehicle or a hybrid vehicle, for example, to supply power to an electrically-powered device that operates with electrical energy.

As illustrated in FIG. 1, the battery pack 60 includes battery modules 10, a battery manager (hereinafter referred to as the BM) 62, and a current sensor 64. Each battery module 10 includes an assembled battery 12 and a cell sensor (hereinafter referred to as the CS) 20. The assembled battery 12 includes secondary batteries (cells) 14 (see FIG. 2). The cell sensor 20 is a board on which a sensor unit 30 and a communication circuit 28 are arranged. The BM 62 manages the battery module 10. The BM 62 and the CS 20 are an example of a condition estimation device. Each secondary battery 14 is an example of an electric storage device. A battery capacity X of the secondary battery 14 is an example of an electric device condition.

The assembled batteries 12 in the battery modules 10 and the current sensor 64 are connected in series via an electric line 68 and are connected to a charger/load 18. The charger of the charger/load 18 is installed in an electric vehicle. The load of the charger/load 18 is a power source, for example, and is arranged inside the electric vehicle. The charger of the charger/load 18 is a regular charger that can be plugged into a wall outlet. The charger of the charger/load 18 detects a voltage of the assembled battery 12 and charges the assembled battery 12 at a constant current until the assembled battery 12 reaches a switching voltage. The charger of the charger/load 18 then charges the assembled battery 12 at a constant voltage after the assembled battery 12 has reached the switching voltage.

The BM 62 includes a central processing unit (hereinafter referred to as the CPU) 70 and a communication unit 74. As illustrated in FIG. 1, the CPU 70 includes a memory 76 such as ROM and RAM, a timer 77 configured to time, an analog-to-digital converter (hereinafter, referred to as the ADC) 78 configured to convert a current value I that is detected as an analog signal into a digital value. The memory 76 stores various programs (including a battery management program) for controlling operations of the CSs 20. The CPU 70 is configured to control components of the battery pack 60, for example, by executing a capacity estimation sequence, which will be described later, according to the program read out of the memory 76. The memory 76 stores correlation data (see FIG. 4) that represents a correlation between a voltage V at which a second distinctive point P2 appears and a battery capacity X, which is required for the capacity estimation sequence, for example. The CPU 70 is an example of a controller.

The communication unit 74 is connected to the CS 20, which included in each battery module 10, via a communication line 80. The communication unit 74 receives data such as voltages V and temperatures D that are determined at each CS 20, which will be described later. The CPU 70 monitors the assembled batteries 12 based on the data received by the communication unit 74 and estimates the battery capacity X of each secondary battery 14.

The battery pack 60 also includes an operation unit (not illustrated) for receiving inputs from a user and a liquid crystal display (not illustrated) for displaying deterioration levels of the assembled batteries 12 and other information.

Figure 2:
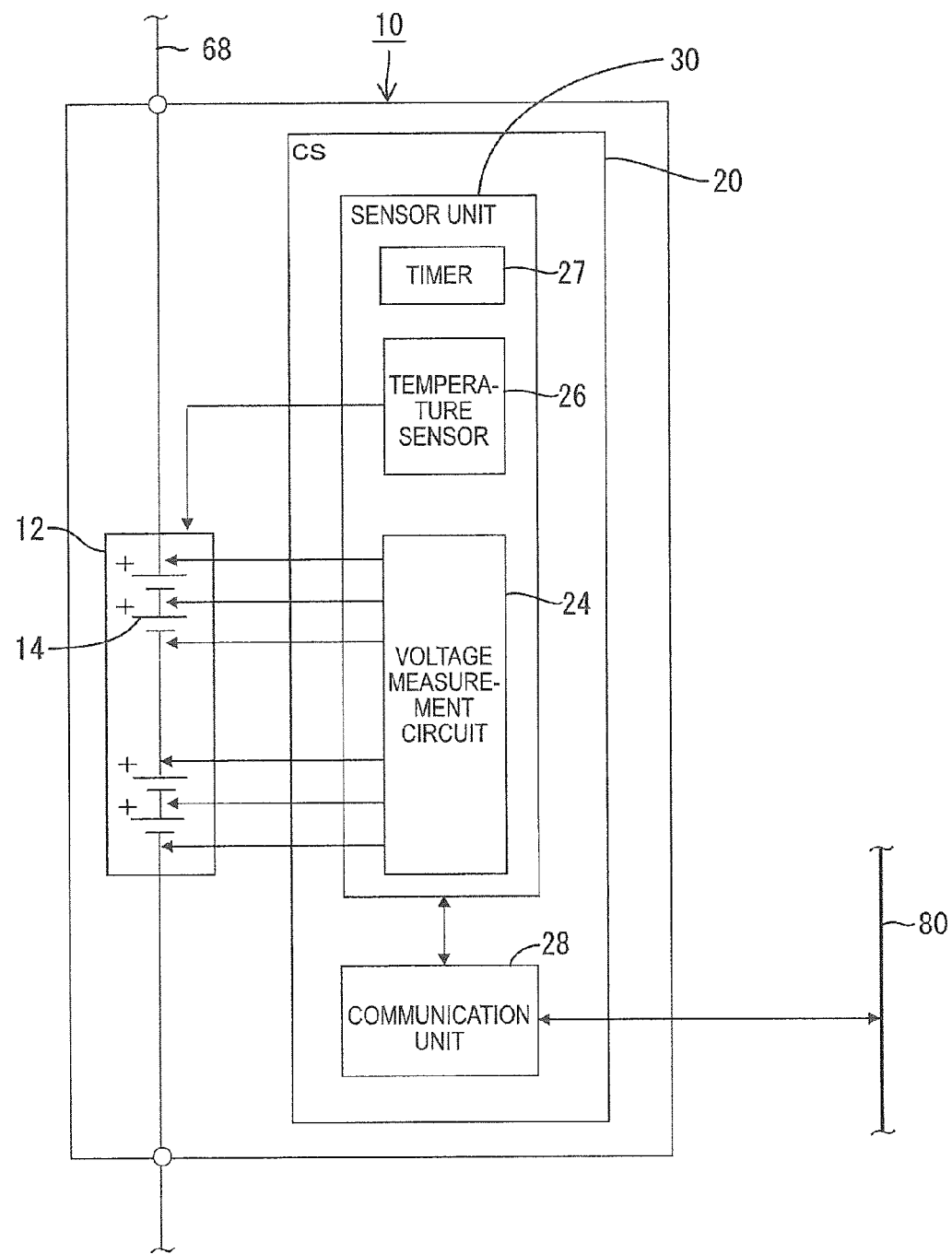
FIG. 2 is a schematic view illustrating a configuration of a battery module.

A configuration of the battery module 10 is schematically illustrated in FIG. 2. Each assembled battery 12 includes the secondary batteries 14 that are rechargeable. Each CS 20 includes a sensor unit 30 and a communication unit 28. The sensor unit 30 includes a voltage measurement circuit 24, a temperature sensor 26, and a timer 27. The timer 27 is used for determining time to measure the voltage V or the temperature D. The voltage measurement circuit 24 is an example of a voltage measurement circuit.

The voltage measurement circuit 24 is connected to terminals of each secondary battery 14 included in the assembled battery 12 and measures the voltage V (V) across the secondary battery 14 every predetermined period. The temperature sensor 26 is a contact-type temperature sensor or a noncontact-type temperature sensor. The temperature sensor 26 measures a temperature D (° C.) of each secondary battery 14 included in the assembled battery 12 every predetermined period.

The communication unit 28 is connected to the BM 62 via a communication line 80. The communication unit 28 sends information including the voltage V and the temperature D measured by the CS 20 to the BM 62. The BM 62 stores the voltage V and the temperature D sent by each CS 20 in the memory 76.

2. Principle of Capacity Estimation

The battery capacity X of the secondary battery 14 decreases as the secondary battery 14 deteriorates, and thus the battery capacity X thereof is required to be calculated on a regular basis. The battery capacity X corresponds to a quantity of electricity that can be discharged from the battery during a period in which a discharge voltage of the battery decreases from a rated voltage at a start of discharge to a predetermined discharge cut-off voltage. The battery capacity X is measured in ampere-hours (Ah), which is a product of current and time.

In the secondary battery 14 such as a lithium ion secondary battery, a distinctive point P may appear in voltages during the charge or the discharge due to an effect of an active material in electrodes of the battery or changes in chemical process. The distinctive point P is a point at which a variation in voltage per unit remaining capacity or per unit time of the secondary battery 14 during the charge or the discharge is a local maximum value.

Examples of the lithium ion secondary battery that has the distinctive point P include a ternary lithium ion secondary battery and an olivine iron based lithium ion secondary battery. The ternary lithium ion secondary battery includes lithium containing metal oxide that contains an element of Co, Mn, Ni as a positive active material. The olivine iron based lithium ion secondary battery includes olivine type iron phosphate as the positive active material, i.e., lithium iron phosphate ($LiFePO4$). As a negative active material, graphite or carbon may be used.

Figure 3:
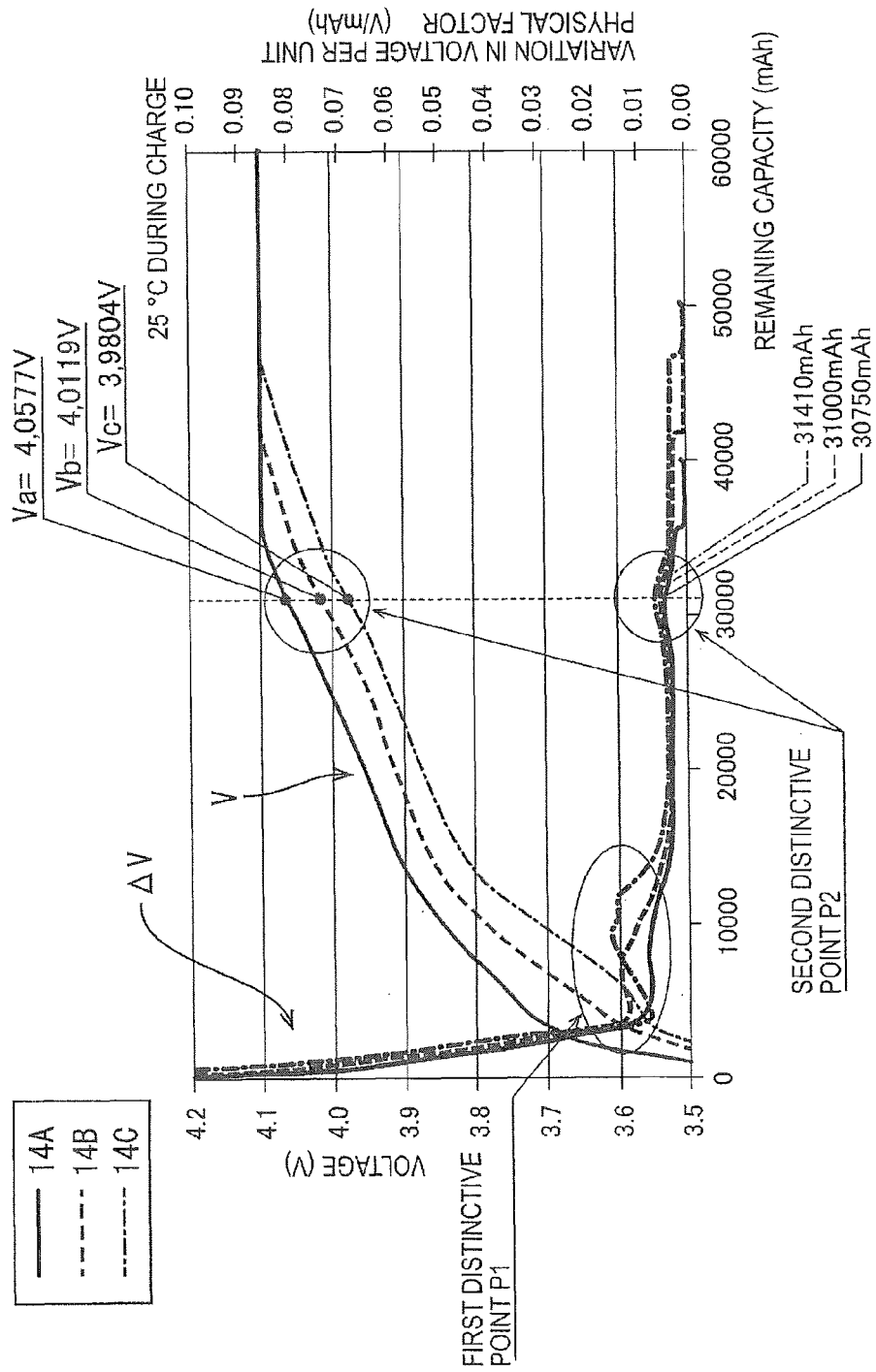
FIG. 3 is a graph illustrating variations in voltage, variations in voltage per unit remaining capacity or per unit time, and variations in charge current of a secondary battery during charge at an ambient temperature of 25° C.

The inventors conducted experiments and studies to find out a correlation between the battery capacity X of the secondary battery 14 and the distinctive point P. The inventors found that points (on a remaining capacity axis or a time axis) at which the distinctive points P appeared were not much different from one another when the secondary batteries 14 were charged or discharged under the same conditions (such as at the same charging rate) although the secondary batteries 14 had different capacities. A graph in FIG. 3 has a horizontal axis representing a remaining capacity (a remaining capacity axis) and a vertical axis representing a voltage. In FIG. 3, a variation in voltage V and a variation in voltage per unit remaining capacity $\Delta V$ during charge of a lithium ion secondary battery that has an initial capacity of 50 Ah from the SOC of 0(%) at the rate of 0.2 (CA) under an ambient temperature of 25° C. are represented. The lithium ion battery is, specifically, a ternary lithium ion secondary battery that includes the lithium containing metal oxide that contains an element of Co, Mn, Ni as a positive active material and the graphite as the negative positive material.

In an example illustrated in FIG. 3, a first distinctive point P1 appears in a low voltage region of about 3.6 (V) to 3.8 (V) and a second distinctive point P2 appears in a high voltage region of about 3.95 (V) to 4.06 (V). Voltages at the positive electrode and voltages at the negative electrode of the lithium ion secondary battery 14 were separately measured and the variations $\Delta V$ were determined. Distinctive points in the cases of the positive electrode and the negative electrode are referred to as distinctive points P in the following description. In the case of the positive electrode, the distinctive point P appeared about the first distinctive point P1 (about the remaining capacity of about 10000 (mAh) in the example in FIG. 3). In the case of the negative electrode, the distinctive point P appeared about the second distinctive point P2 (about the remaining capacity of about 31000 (mAh) in the example in FIG. 3). Accordingly, it is assumed that the first distinctive point P1 appears due to the influence of the positive active material and the distinctive and the second distinctive point P2 appears due to the influence of the negative active material.

In the high voltage region, the points (on the remaining capacity axis or the time axis) at which the second distinctive points P2 appear are not much different from one another although batteries have different battery capacities X. In the cases of three lithium ion secondary batteries 14A to 14C that have different battery capacities X, the second distinctive points P2 appear about the remaining capacity of 31000 (mAH). Specifically, the second distinctive point P2 appears at the remaining capacity of 30750 (mAH) in the case of the lithium ion secondary battery 14A, the second distinctive point P2 appears at the remaining capacity of 31000 (mAH) in the case of the lithium ion secondary battery 14B, and the second distinctive point P2 appears at the remaining capacity of 31410 (mAH) in the case of the lithium ion secondary battery 14C.

The lithium ion secondary battery 14A is a deteriorated battery that has the battery capacity X of 39.9 (Ah) and a capacity retention rate of 79.8(%). The lithium ion secondary battery 14B is a deteriorated battery that has the battery capacity X of 44.55 (Ah) and a capacity retention rate of 89.1(%). The lithium ion secondary battery 14C is a new battery that has the battery capacity X of 50 (Ah) and a capacity retention rate of 100(%).

When the battery capacity X becomes smaller, the voltage of the secondary battery 14 increases more rapidly during the charge. If the lithium ion secondary batteries 14 that have different battery capacities X are charged at the same charging rate, the second distinctive points P2 appear at different voltages.

More specifically described, as illustrated in FIG. 3, the second distinctive point P2 appears at the voltage of 3.9804 (V) in the case of the secondary battery 14C, and the second distinctive point P2 appears at the voltage of 4.0119 (V) in the case of the secondary battery 14B. Further, the second distinctive point P2 appears at the voltage of 4.0577 (V) in the case of the secondary battery 14A. The smaller the battery capacity X of the secondary battery 14, the higher the voltage at which the second distinctive point P2 appears. The charging rate is a rate calculated based on an amount of charging current relative to an initial capacity of a battery.

By measuring the voltage V at which the second distinctive point P2 appears, the battery capacity X of the secondary battery 14 can be estimated. For example, experiments may be conducted for measuring voltages of the secondary batteries 14 having different battery capacities X at which the second distinctive points P2 appear during charge of the secondary batteries 14 from 0% SOC. Then, correlation data that contains the voltages V at which the second distinctive points P2 appear in association with the battery capacities X of the secondary batteries 14 (see FIG. 4) may be created. A battery capacity X of a secondary battery 14 can be estimated based on the correlation data.

Figure 5:
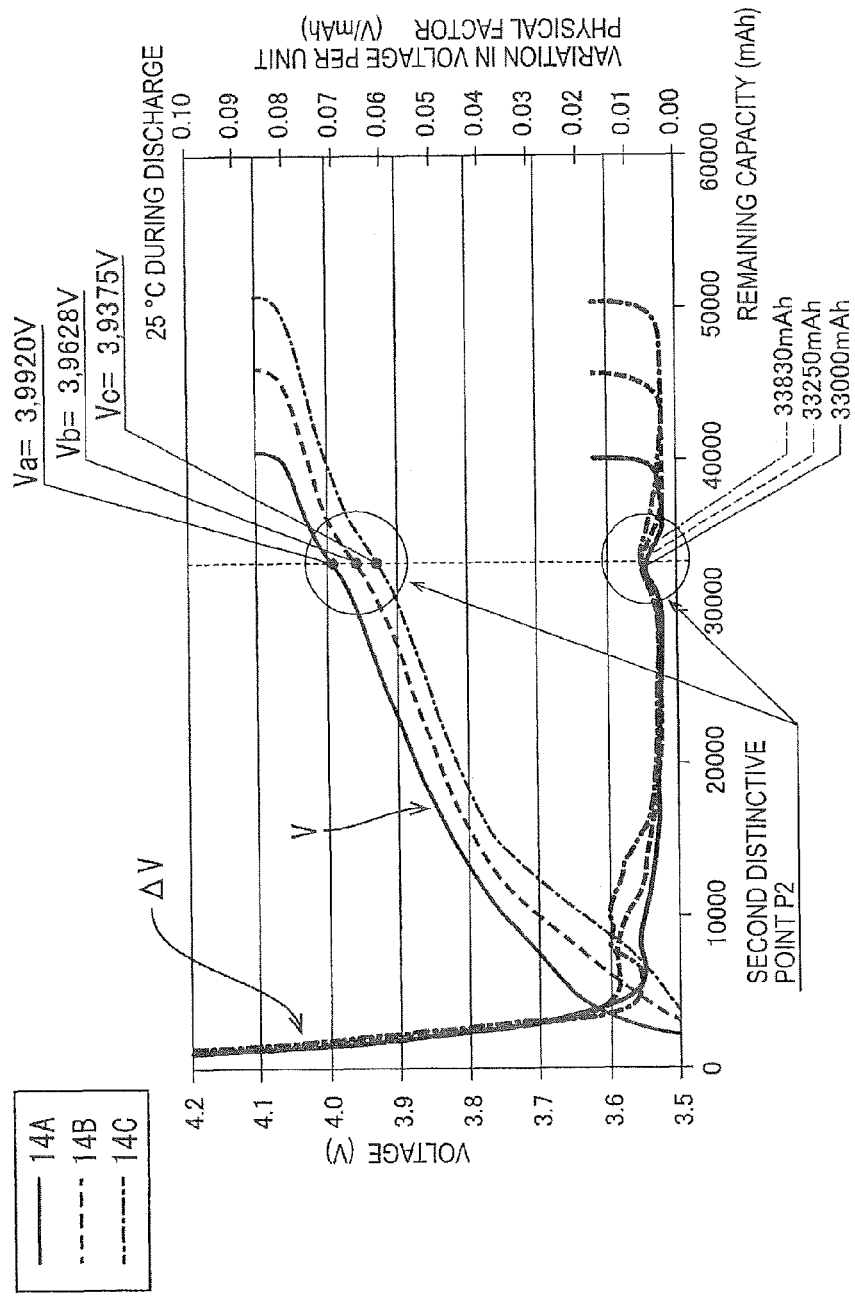
FIG. 5 is a graph illustrating variations in voltage, variations in voltage per unit remaining capacity or per unit time, and variations in charge current of a secondary battery during discharge at an ambient temperature of 25° C.
Figure 6:
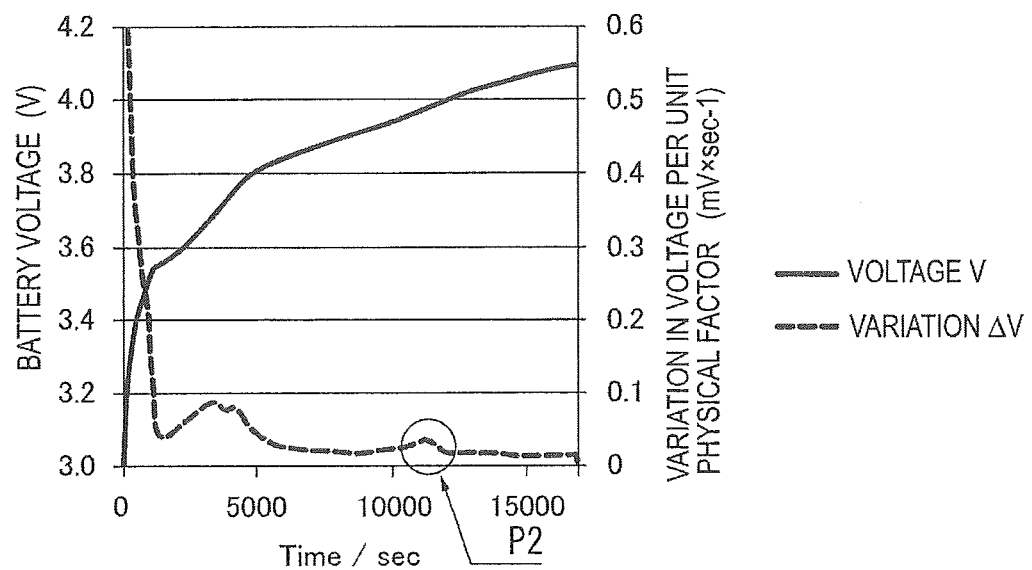
FIG. 6 is a graph illustrating variations in voltage and variations in voltage per unit remaining capacity or per unit time of the secondary battery during charge at a charge rate of 0.2 (CA)
Figure 7:
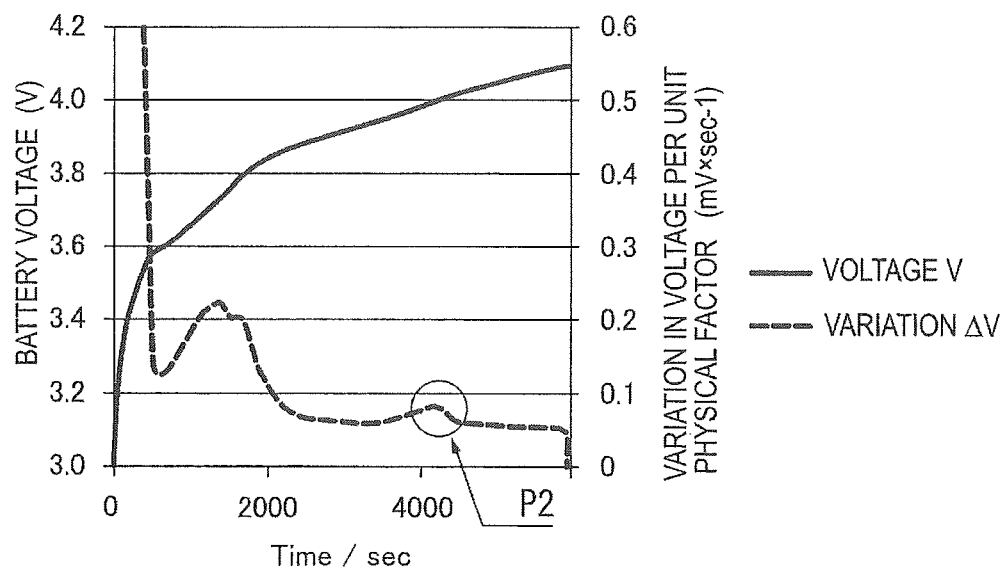
FIG. 7 is a graph illustrating variations in voltage and variations in voltage per unit remaining capacity or per unit time of the secondary battery during charge at a charge rate of 0.5 (CA)
Figure 8:
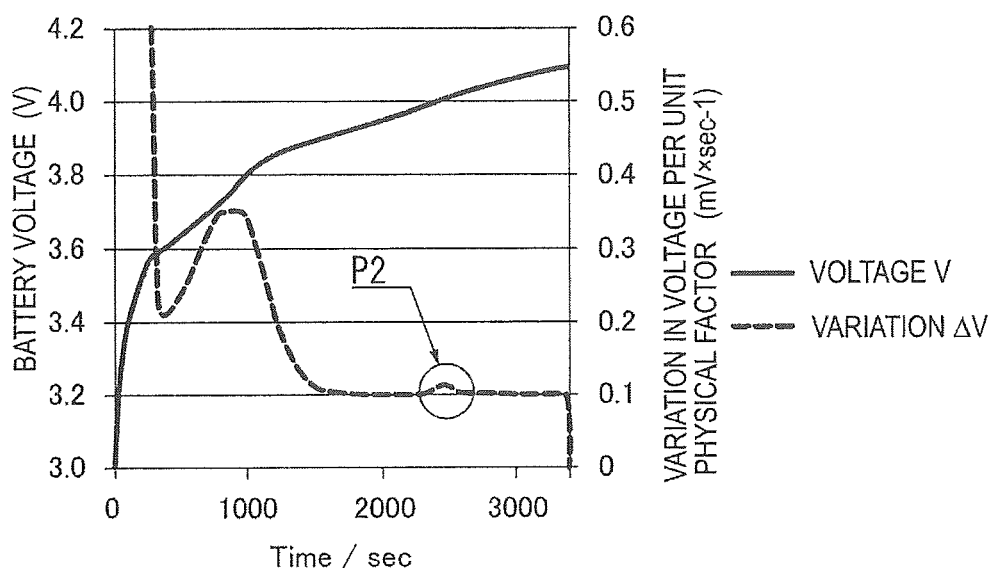
FIG. 8 is a graph illustrating variations in voltage and variations in voltage per unit remaining capacity or per unit time of the secondary battery during charge at a charge rate of 0.8 (CA)
Figure 9:
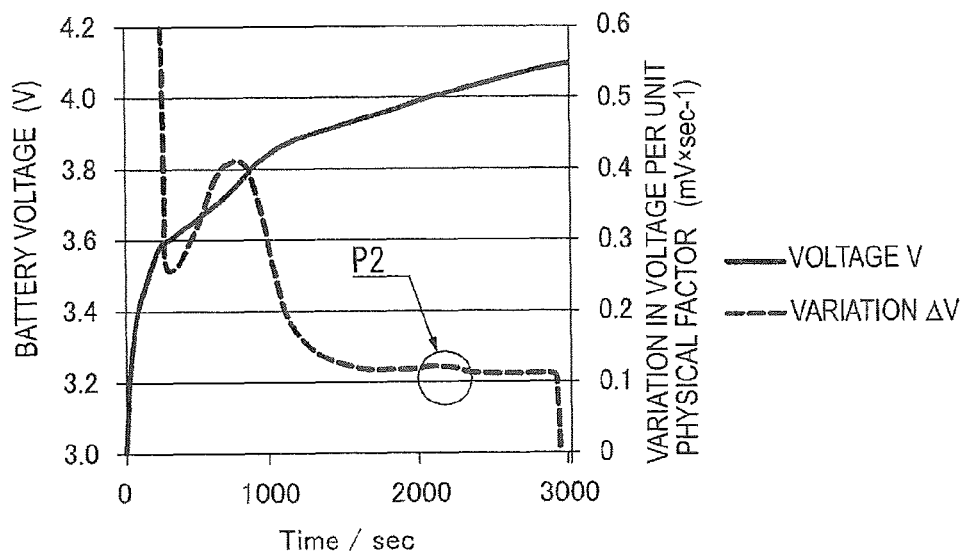
FIG. 9 is a graph illustrating variations in voltage and variations in voltage per unit remaining capacity or per unit time of the secondary battery during charge at a charge rate of 0.9 (CA)
Figure 10:
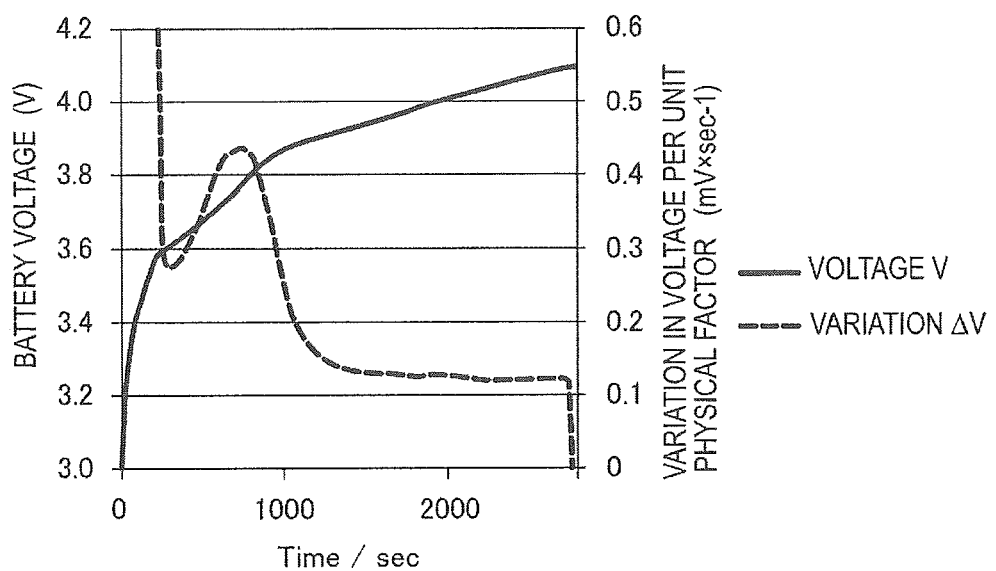
FIG. 10 is a graph illustrating variations in voltage and variations in voltage per unit remaining capacity or per unit time of the secondary battery during charge at a charge rate of 1.0 (CA)

A graph in FIG. 5 has a remaining capacity axis as a horizontal axis and a voltage axis as a vertical axis. In FIG. 5, a variation in voltage V and a variation in voltage per unit remaining capacity $\Delta V$ during discharge of a lithium ion secondary battery that has an initial capacity of 50 Ah from the SOC of 100(%) at the rate of 0.2 (CA) under an ambient temperature of 25° C. are represented. Similar to the example in FIG. 3, the lithium ion secondary battery 14A is a deteriorated battery that has the battery capacity X of 39.9 (Ah) and a capacity retention rate of 79.8(%). The lithium ion secondary battery 14B is a deteriorated battery that has the battery capacity X of 44.55 (Ah) and a capacity retention rate of 89.1(%). The lithium ion secondary battery 14C is a new battery that has the battery capacity X of 50 (Ah) and a capacity retention rate of 100(%).

As illustrated in FIG. 5, during discharge of the secondary battery 14, the smaller the battery capacity X of the secondary battery 14, the higher the voltage at which the second distinctive point P2 appears, which is the same tendency exhibited during charge of the secondary battery 14. However, during discharge, the voltage at which the distinctive point appears is 3.9375 (V) in the case of the secondary battery 14C, 3.9628 (V) in the case of the secondary battery 14B, and 3.9920 (V) in the case of the secondary battery 14A, that is, the voltage tends to be lower than the voltage at which the second distinctive point P2 appears during charge. Therefore, different pieces of the correlation data as in FIG. 4 may be prepared for the case of charging and that of discharging.

As illustrated in FIG. 5, the remaining capacity at which the second distinctive point P2 appears during discharge tends to be larger than the remaining capacity at which the second distinctive point P2 appears during charge. Specifically, the second distinctive point P2 appears at the remaining capacity of 33000 (mAH) in the case of the lithium ion secondary battery 14A, the second distinctive point P2 appears at the remaining capacity of 33250 (mAH) in the case of the lithium ion secondary battery 14B, and the second distinctive point P2 appears at the remaining capacity of 33830 (mAH) in the case of the lithium ion secondary battery 14C.

A correlation between the charging rate and the second distinctive point P2 were examined based on voltages of the lithium ion secondary battery 14 having a capacity of 50 Ah (more specifically, the ternary lithium ion secondary battery) measured while the secondary battery 14 was charged at different charging rates under the ambient temperature of 25° C. As illustrated in FIGS. 6 to 10, the second distinctive points P2 clearly appeared when the secondary battery 14 was charged at the charging rate in a rage from 0.2 (CA) to 0.9 (CA) while a noticeable second distinctive point P2 did not appear when the secondary battery 14 was charged at the charging rate of 1 (CA). Namely, a lower charging rate is preferable and a charging rate of 0.9 (CA) or lower is preferable.

3. Determination of Distinctive Point

As illustrated in FIG. 3 or FIG. 5, there are multiple distinctive points, the first distinctive point P1 and the second distinctive point P2. If a distinctive point P is detected based on the variation $\Delta V$, it is required to determine whether the distinctive point P is the second distinctive point P2.

Whether the distinctive point P is the second distinctive point P2 can be determined based on a startup voltage $V_O$ that is a voltage at a start of charge. Specifically, if the startup voltage $V_O$ is lower than a voltage V1 at which the first distinctive point P1 appears, the first distinctive point P1 appears after the charge is started and then the second distinctive point P2 appears. Therefore, the distinctive point P that appears second is determined as the second distinctive point P2. If the startup voltage $V_O$ is between the voltage V1 at which the first distinctive point P1 appears and a voltage V2 at which the second distinctive point P2 appears, the first distinctive point P1 does not appear after the charge is started and only the second distinctive point P2 appears. Therefore, the distinctive point P that appears first is determined as the second distinctive point P2. Whether the distinctive point P is the second distinctive point P2 can be determined based on another parameter having a correlation with a voltage other than the startup voltage $V_O$, such as an SOC or a remaining capacity at a start of charge.

4. Capacity Estimation Sequence

Figure 11:
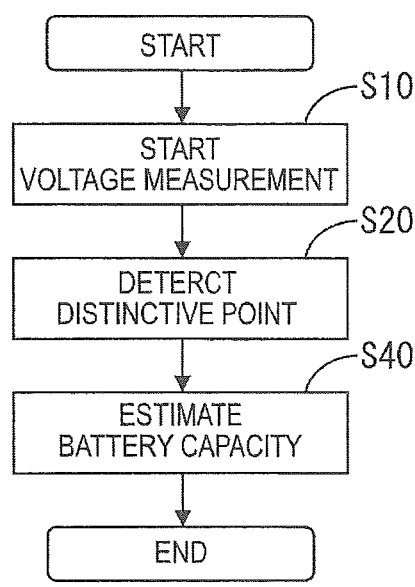
FIG. 11 is a brief flowchart of a battery capacity estimation sequence.
Figure 12:
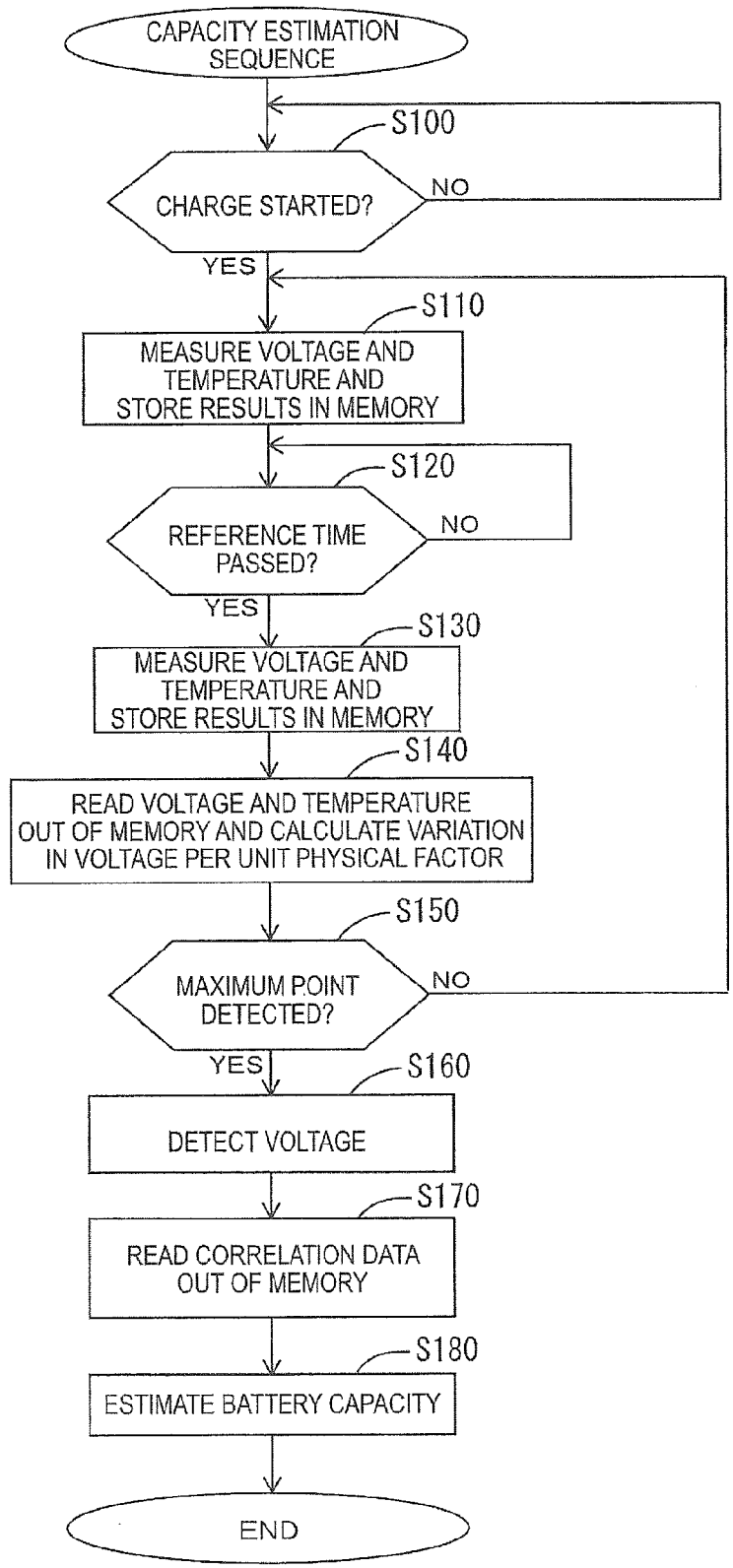
FIG. 12 is a detailed flowchart of the battery capacity estimation sequence.

Next, a capacity estimation sequence for estimating the battery capacity X of the secondary battery 14 will be described with reference to FIGS. 11 and 12. The capacity estimation sequence is executed by the CPU 70 in the BM 62 during the charge of the secondary battery 14.

The CPU 70 determines whether the charge of the secondary battery 14 by the charger of the charger/load 18 is started (S100). If the charge is not started (NO in step S100), the CPU 70 waits until the charge is started. If the charge is started (YES in step S100), the CPU 70 controls the CS 20 to start measurement of a voltage V and measurement of a temperature D (S10, S110) of the secondary battery 14. The measurement of the voltage V and that of the temperature D are repeatedly performed in a predetermined cycle. The CPU 70 controls the CS 20 to transmit information including the measured voltage V and the measured temperature D together with information including time at which the measurement is performed to the BM 62 via the communication line 80. The CPU 70 converts the information including the voltage V (e.g., V3) and the temperature D transmitted to the BM 62 to digital data in the ADC 78, and stores the digital data with the information including the time (e.g., t3) in the memory 76 (S110). Steps S100 and S110 in FIG. 12 correspond to the step for starting the voltage measurement (S10) in FIG. 11.

When the CPU 70 receives the information including the voltage V and the temperature D of the secondary battery 14 from the CS 20, the CPU 70 starts detection of the distinctive point P (S20). Specifically, the CPU 70 determines whether time (reference time) to control the CS 20 for the next measurement of the voltage V and that of the temperature D of the secondary battery 14 has passed after the CPU 70 has received the information including the voltage V and the temperature D of the secondary battery 14 from the CS 20 (S120). If the time has not passed (NO in step S120), the CPU 70 waits until the time passes. If the time has passed (YES in step S120), the CPU 70 controls the CS 20 to perform the measurement of the voltage V and that of the temperature D (S130). The CPU 70 converts the information including the voltage V (e.g., V4) and the temperature D transmitted to the BM 62 to digital data in the ADC 78, and stores the digital data with the information including the time (e.g., t4) in the memory 76 (S130).

The CPU 70 reads the data on the voltages of the secondary battery 14 (e.g., V3 and V4) and data on the measurement time t at which the measurement is performed (e.g., t3 and t4) out of the memory 76. The CPU 70 calculates the variation $\Delta V$ at each time t (see Equation 1 below) (S140). Then, the CPU 70 compares the variations $\Delta V$ for the times t to determine if each variation $\Delta V$ is a local maximum value (S150). If the variation $\Delta V$ is not the local maximum value (NO in step S150), the process returns to the step S110. If the variation $\Delta V$ is the local maximum value (YES in step S150), the CPU 70 detects the second distinctive point P2 that is the local maximum value in the high voltage region according to the above-described method (determination based on the startup voltage Vo) and detects the voltage at which the second distinctive point P2 appears (S160). Steps S20 corresponds to a distinctive point detection process and a step for detecting a distinctive point. Steps 120 to 150 in FIG. 12 correspond to the step for detecting the distinctive point (S20) in FIG. 11.

$$\Delta V=(V4-V3)/(t4-t3) \quad (1)$$

In the above, the CPU 70 detects the distinctive point P based on calculation of the local maximum value of the variation $\Delta V$ per unit time, but may detect the distinctive point P based on calculation of the local maximum value of the variation $\Delta V$ per unit remaining capacity.

After the CPU 70 detects the second distinctive point P2 and the voltage at which the second distinctive point P2 appears, the CPU 70 reads the correlation data out of the memory 76 (S170), and then estimates the battery capacity X of the secondary battery 14 (S40, S180). Specifically, the CPU 70 refers to the correlation data for the voltage, which is detected in step S20, at which the second distinctive point P2 appears and estimates that the battery capacity X that is in association with the voltage V as the battery capacity X of the secondary battery 14. For example, if the voltage V at which the second distinctive point P2 appears is Va in FIG. 4, the CPU 70 estimates the battery capacity X of the secondary battery 14 as Xa. Then, when the secondary battery 14 is fully charged, the CPU 70 ends the capacity estimation sequence. Step 40 corresponds to the estimation process and the estimation step. Steps 160 to 180 in FIG. 12 correspond to the battery capacity estimation (S40) in FIG. 11.

5. Effects of the Embodiment

In the BM 62 according to this embodiment, the CPU 70 estimates the battery capacity X of the secondary battery 14 based on the voltage of the secondary voltage 14 at which the distinctive point P appears. Thus, when the charge is started from the startup voltage Vo, the CPU 70 is required to charge the secondary battery 14 at least until the second distinctive point P2 appears. However, after the second distinctive point P2 appears, the charge of the secondary battery 14 is not required. The CPU 70 can estimate the battery capacity X of the secondary battery 14 without charging or discharging the secondary battery 14 until the secondary battery 14 satisfies a predetermined fully charged condition or a fully discharged condition, which was required in the known technology. As a result, time required for the estimation of the battery capacity X can be shortened. In addition, the CPU 70 can estimate the battery capacity more frequently, because requirements for the estimation of the battery capacity X are reduced.

In the BM 62 according to this embodiment, the CPU 70 selects the second distinctive point P2 in the high voltage region and estimates the battery capacity X if the distinctive point P includes the distinctive points P1, P2. The CPU 70 can correctly determine the voltage V at which the distinctive point appears, because the second distinctive points P2 in the high voltage region appear at points that are not much different from one another compared with the first distinctive points P1 in the low voltage region. Therefore, the CPU 70 can correctly estimate the battery capacity X of the secondary battery 14.

In the BM 62 according to this embodiment, the CPU 70 determines the distinctive point P based on the variation in voltage during the charge. Since the charge current is controlled by the charger 18, the charge current is more stable than the discharge current supplied to the load. Therefore, the CPU 70 can easily detect the distinctive point P.

Second Embodiment

According to the first embodiment, the CPU 70 estimates the battery capacity X of the secondary battery 14 based on the voltage of the secondary battery 14 at which the distinctive point P appears. According to the second embodiment, the CPU 70 estimates the battery capacity X of the secondary battery 14 based on a period T from when the distinctive point P appears until when the secondary battery 14 reaches a set voltage.

Figure 13:
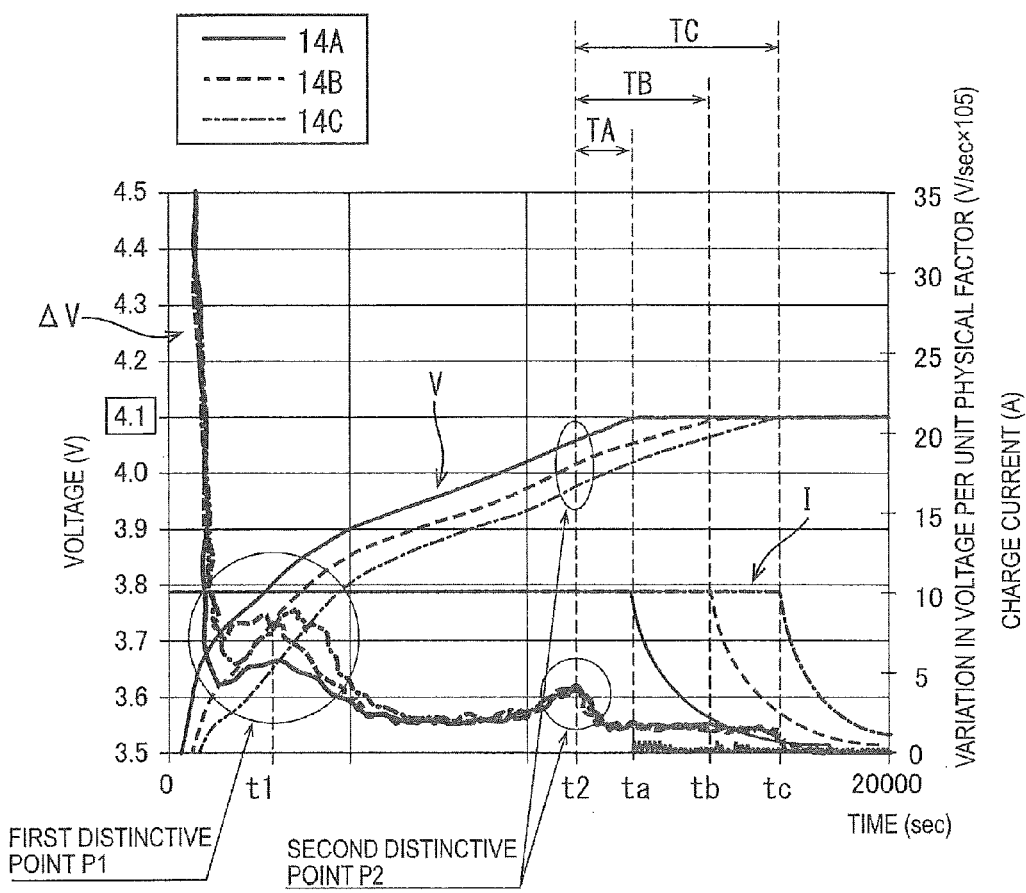
FIG. 13 is a graph illustrating variations in voltage, variations in voltage per unit remaining capacity or per unit time, and variations in charge current of a secondary battery during charge at an ambient temperature of 25° C. according to an embodiment.

More specifically described, as described in the first embodiment, the points at which the distinctive points P appear (on the remaining capacity axis or the time axis) are not much different from one another when the secondary batteries 14 are charged or discharged under the same condition (such as at the same charging rate) although the secondary batteries 14 have different capacities X. A graph in FIG. 13 has a horizontal axis representing a time and a vertical axis representing a voltage and a current. In FIG. 13, a variation in voltage V and a variation in voltage per unit time ΔV during charge of a lithium ion secondary battery that has an initial capacity of 50 Ah from the SOC of 0(%) at the rate of 0.2 (CA) are represented.

When the battery capacity X becomes smaller, the voltage of the secondary battery 14 increases more rapidly during the charge. If the lithium ion secondary batteries 14 that have different battery capacities X are charged at the same charging rate, as illustrated in FIG. 13, the secondary batteries 14 reach the predetermined set voltage at different times. In examples in FIG. 13, the secondary battery 14C reaches the set voltage of 4.1 (V) at a time tc. The secondary battery 14B reaches the set voltage of 4.1 (V) at a time tb and the secondary battery 14A reaches the set voltage of 4.1 (V) at a time ta. The smaller the battery capacity X, the sooner the secondary battery 14 reaches the set voltage. Periods from the time t2 at which the second distinctive point P2 appears until when the secondary batteries 14A to 14C reach the set voltage are referred to as periods TA to TC, respectively. The periods TA to TC may be correctively referred to as the period T.

As can be seen from the above, the smaller the battery capacity X of each secondary battery 14A to 14C, the shorter the periods TA to TC from the time t2 at which the second distinctive point P2 appears until when the secondary battery 14 reaches the set voltage. By measuring the period T, the battery capacity X of the secondary battery 14 can be estimated. For example, experiments may be conducted for measuring the periods T using the secondary batteries 14 having different battery capacities X. Then, correlation data that contains the periods T in association with the battery capacities X of the secondary batteries 14 (see FIG. 14) may be created. A battery capacity X of a secondary battery 14 can be estimated based on the correlation data.

In the above embodiment, the set voltage was 4.1 (V). However, the set voltage is not limited to 4.1 (V) and may be other values. Specifically, if the period T is measured based on the variations in voltage during the charge, the set voltage may be any voltage that is higher than the voltage at which the distinctive point P appears. In this embodiment, the second distinctive point P2 appears in a region of 3.95 (V) to 4.05 (V), and thus any voltage higher than 4.05 (V) may be used as the set voltage.

If the period T is measured based on the variations in voltage during the discharge, the set voltage may be any voltage that is lower than the voltage at which the distinctive point P appears. In this embodiment, the second distinctive point P2 appears in a region of 3.95 (V) to 4.05 (V), and thus any voltage lower than 3.95 (V) may be used as the set voltage.

Figure 15:
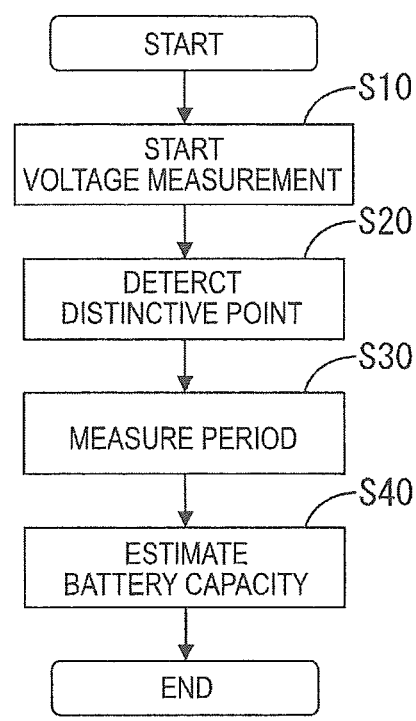
FIG. 15 is a brief flowchart of a battery capacity estimation sequence.
Figure 16:
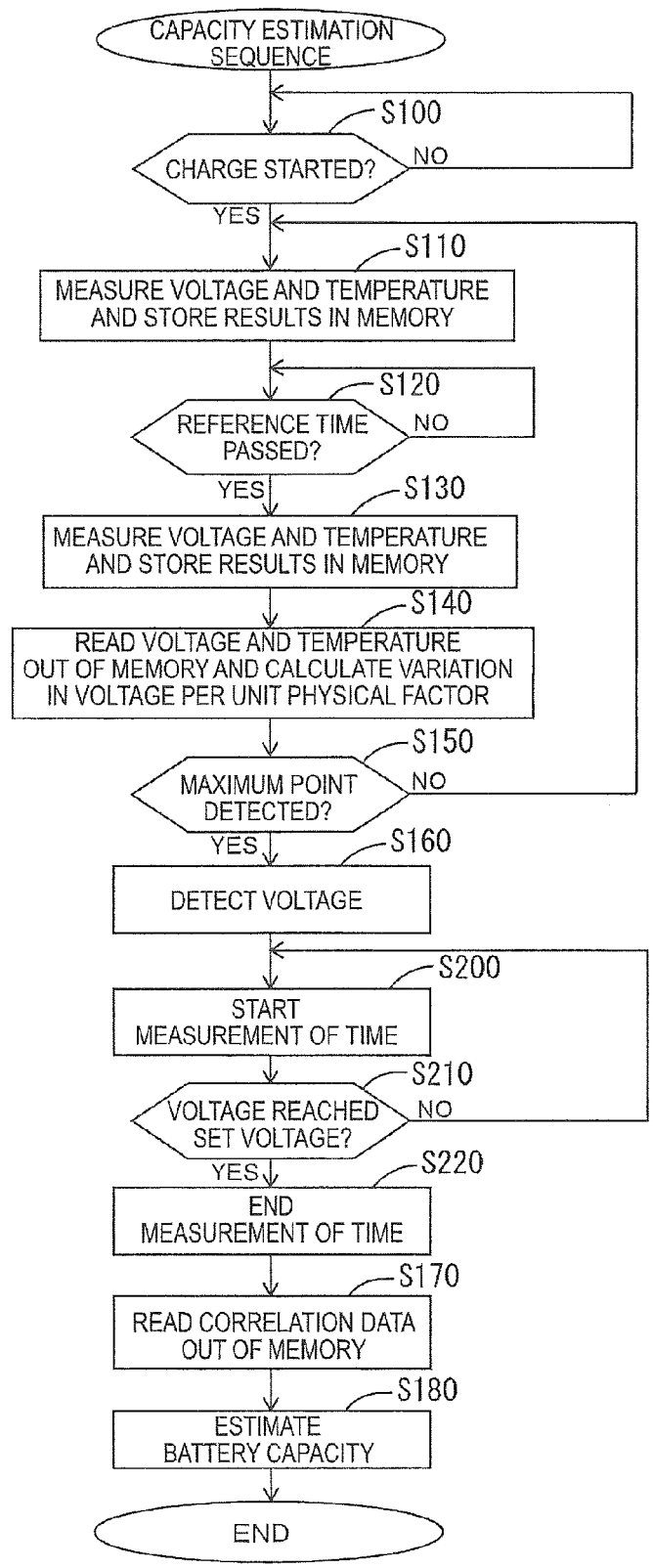
FIG. 16 is a detailed flowchart of the battery capacity estimation sequence.

Next, a capacity estimation sequence for estimating the battery capacity X of the secondary battery 14 will be described with reference to FIGS. 15 and 16. The capacity estimation sequence is executed by the CPU 70 in the BM 62 during the charge of the secondary battery 14.

The CPU 70 determines whether the charge of the secondary battery 14 by the charger of the charger/load 18 is started (S100). If the charge is not started (NO in step S100), the CPU 70 waits until the charge is started. If the charge is started (YES in step S100), the CPU 70 controls the CS 20 to start measurement of a voltage V and measurement of a temperature D (S10, S110) of the secondary battery 14. The measurement of the voltage V and that of the temperature D are repeatedly performed in a predetermined cycle. The CPU 70 controls the CS 20 to transmit information including the measured voltage V and the measured temperature D together with information including time at which the measurement is performed to the BM 62 via the communication line 80. The CPU 70 converts the information including the voltage V (e.g., V3) and the temperature D transmitted to the BM 62 to digital data in the ADC 78, and stores the digital data with the information including the time (e.g., t3) in the memory 76 (S110). Steps S100 and S110 in FIG. 16 correspond to the step for starting the voltage measurement (S10) in FIG. 15.

When the CPU 70 receives the information including the voltage V and the temperature D of the secondary battery 14 from the CS 20, the CPU 70 starts detection of the distinctive point P (S20). Specifically, the CPU 70 determines whether time (reference time) to control the CS 20 for the next measurement of the voltage V and that of the temperature D of the secondary battery 14 has passed after the CPU 70 has received the information including the voltage V and the temperature D of the secondary battery 14 from the CS 20 (S120). If the time has not passed (NO in step S120), the CPU 70 waits until the time passes. If the time has passed (YES in step S120), the CPU 70 controls the CS 20 to perform the measurement of the voltage V and that of the temperature D (S130). The CPU 70 converts the information including the voltage V (e.g., V4) and the temperature D transmitted to the BM 62 to digital data in the ADC 78, and stores the digital data with the information including the time (e.g., t4) in the memory 76 (S130).

The CPU 70 reads the data on the voltages V of the secondary battery 14 (e.g., V3 and V4) and data on the time t at which the measurement is performed (e.g., t3 and t4) out of the memory 76. The CPU 70 calculates the variation ΔV at each time t (see Equation 1 of the first embodiment) (S140). Then, the CPU 70 compares the variations ΔV at each measurement time t to determine if each variation ΔV is a local maximum value (S150). If the variation ΔV is not the local maximum value (NO in step S150), the process returns to the step S110. If the variation ΔV is the local maximum value (YES in step S150), the CPU 70 detects the second distinctive point P2 that is the local maximum value in the high voltage region and the voltage at which the second distinctive point P2 appears according to the above-described method (determination based on the startup voltage Vo) (S160). Step S20 corresponds to a distinctive point detection process, a step for detecting a distinctive point. Steps 120 to 150 in FIG. 16 correspond to a step for detecting a distinctive point (S20) in FIG. 15.

Then, the CPU 70 compares the voltage V of the secondary battery 14 measured by the CS 20 with the set voltage (e.g., 4.1 (V)) (S210), and measures the period T from the time t2 when the second distinctive point P2 appears until when the secondary battery 14 reaches the set voltage. Specifically, the CPU 70 obtains the time when the secondary battery 14 reaches the set voltage based on the result of the comparison and the period measured by the timer 27 to measure the period T from the time t2 when the second distinctive point P2 appears until when the secondary battery 14 reaches the set voltage. S30 corresponds to a period determination process.

More specifically described, the CPU 70 starts the measurement of the period T (S200) and determines whether the voltage V of the secondary battery 14 has reached the set voltage (S210). If the voltage V of the secondary battery 14 has not reached the set voltage (NO in step S210), the process returns to the step S200. If the voltage V of the secondary battery has reached the set voltage (YES in step S210), the CPU 70 ends the measurement of the period T (S220). Steps 160 to 220 in FIG. 16 correspond to the period measurement (S30) in FIG. 15.

After the measurement of the period T, the CPU 70 reads the correlation data out of the memory 76 (S170), and estimates the battery capacity X of the secondary battery 14 (S40, S180). Specifically, the CPU 70 refers to the correlation data for the periods T and estimates the battery capacity X that is in association with each period T as the battery capacity X of the secondary battery 14. For example, if the period T is T1 in FIG. 14, the CPU 70 estimates the battery capacity X of the secondary battery 14 as X1. Then, when the secondary battery 14 is fully charged, the CPU 70 ends the capacity estimation sequence. Step 40 corresponds to the estimation process and the estimation step. Steps 170 to 180 in FIG. 16 correspond to the battery capacity estimation (S40) in FIG. 15.

In the BM 62 according to this embodiment, the CPU 70 estimates the battery capacity X of the secondary battery 14 based on the period T from when the distinctive point P appears until when the secondary battery 14 reaches the set voltage. The CPU 70 can determine the period T by measuring a period from when the secondary battery 14 is at a voltage slightly lower than the distinctive point P and when the secondary battery reaches the set voltage. The CPU 70 can estimate the battery capacity X of the secondary battery 14 without charging or discharging the secondary battery 14 until the secondary battery 14 satisfies the fully discharged condition or the fully charged condition, which was required in the known technology. As a result, the time required for the estimation of the battery capacity X can be shortened. In addition, the CPU 70 can estimate the battery capacity more frequently, because requirements for the estimation of the battery capacity X are reduced.

In the BM 62 according to this embodiment, the CPU 70 determines the second distinctive point P2 in the high voltage region as a reference distinctive point. The period is measured based on the reference distinctive point. The second distinctive point P2 in the high voltage region is proper as the reference for measuring the period, because the second distinctive points P2 in the high voltage region appear at points that are not much different from one another compared with the first distinctive points P1 in the low voltage region. A difference in the period T depending on the capacity is clearer when the period T is measured based on the second distinctive points P2 that appears at points that are not much different from one another. With this configuration, the CPU 70 can correctly estimate the battery capacity X of the secondary battery 14.

The CS 20 measures the voltage of the secondary battery 14 every predetermined period. The BM 62 monitors the condition of the secondary battery 14 based on the value measured by the CS 20. In the BM 62 according to this embodiment, the CPU 70 determines whether the voltage V of the secondary battery 14 has reached the set voltage based on the value (the voltage of the secondary battery 14) measured by the CS 20. In this configuration, the period T from the time t2 when the second distinctive point P2 appears and until when the voltage V of the secondary battery 14 reaches the set voltage can be calculated based on the data that has been measured by the CS 20 and the BM 62 (information including the voltage V of the secondary battery 14 and the time at which the measurement is performed). The MB 62 is not required to measure other values.

Third Embodiment

In the second embodiment, the CPU 70 compares the voltage V of the secondary battery 14 measured by the CS 20 to the set voltage (e.g., 4.1 (V)) to measure the period T from the time t2 when the second distinctive point P2 appears until when the secondary battery 14 reaches the set voltage. In the third embodiment, the period T is measured by using a switching signal Sr that informs the switch of the charge mode.

Specifically, the charge mode of the charger of the charge/load 18 is CC/CV (constant current/constant voltage) charging mode. The CPU 70 switches the charge mode from the constant current charging mode to the constant voltage charging mode when the secondary battery 14 reaches the switching voltage (e.g., 4.1 (V)).

In the third embodiment, the CPU 70 sets the set voltage at the same voltage as the switching voltage and controls the charger of the charger/load 18 to transmit the switching signal Sr for informing the BM 62 that the charge mode is switched, i.e., the secondary battery 14 has reached the voltage of 4.1 (V).

In this configuration, like the second embodiment, after the CPU 70 detects the time t2 when the second distinctive point P2 appears based on the voltage V of the secondary battery 14 measured by the CS 20, the CPU 70 can measure the period T only by controlling the timer 77 to measure the period from a time t2 when the second distinctive point P2 appears until when the switching signal Sr is received.

In the third embodiment, the BM 62 is not required to determine whether the secondary battery 14 has reached the set voltage, because the CPU 70 measures the period T by using the switching signal Sr. A processing load on the BM 62 can be reduced.

Fourth Embodiment

In the first embodiment, the CPU 70 estimates the battery capacity X of the secondary battery 14 based on the voltage of the secondary battery 14 at which the distinctive point P appears. In the fourth embodiment, the CPU 70 estimates a remaining capacity at which the second distinctive point P2 appears and determines the remaining capacity as a remaining capacity of the secondary battery 14.

Specifically, as described in the first embodiment with reference to FIGS. 3 and 5, the points (on the remaining capacity axis or the time axis) at which the second distinctive points P2 appear are not much different from one another when the secondary batteries 14 are charged or discharged under the same conditions (such as the same charging rate) although the secondary batteries 14 have different capacities X. Specifically, in the case of charge, a difference between the remaining capacity of the secondary battery 14A, which has the smallest remaining capacity, and the remaining capacity of the secondary battery 14C, which has the largest remaining capacity, is 660 (mAh). In the case of discharge, the a difference between the remaining capacity of the secondary battery 14A, which has the smallest remaining capacity, and the remaining capacity of the secondary battery 14C, which has the largest remaining capacity, is 850 (mAh). If a reference capacity (battery capacity) is 50000 (mAh), the CPU 70 can estimate the remaining capacity within a small tolerance of about 2%.

In this configuration, the CPU 70 can estimate the remaining capacity of the secondary battery 14 with high accuracy by estimating the remaining capacity at which the second distinctive point P2 appears as the remaining capacity of the secondary battery 14. For example, experiments are performed for the secondary batteries 14 having different battery capacities X. Specifically, the secondary batteries 14 are each charged from a SOC of 0(%) to determine the point at which the second distinctive point P2 appears, and then the remaining capacity at which the second distinctive point P2 appears is set as a fixed value Z. The fixed value Z can be determined as the remaining capacity of the secondary battery 14. It is preferable that the fixed value Z is the smallest one of the remaining capacities obtained in the experiments to have less risk of overestimating the remaining capacity, which may result in a sudden stop of the load driven by the secondary battery 14 (hereinafter, referred to as a lack of electricity).

The remaining capacities of the secondary batteries 14 at which the second distinctive points P2 appear are smaller in FIG. 3 than in FIG. 5 by 2000 (mAh) when the secondary batteries 14 having the same battery capacities X are compared. In view of this, two experiments are performed by using the secondary batteries 14 that have different battery capacities X. In one of the experiments, the secondary battery 14 is charged from a SOC of 0(%) to measure the remaining capacity of the secondary battery 14 at which the second distinctive point P2 appears. In the other one of the experiments, the secondary battery 14 is discharged from a SOC of 100(%) to measure the remaining capacity of the secondary battery 14 at which the second distinctive point P2 appears. It is preferable that a ratio W of the remaining capacities at which the second distinctive points P2 appear during the charge to during the discharge is calculated for the secondary batteries 14 having the same battery capacity X. The remaining capacity of the secondary battery 14 during the charge and the discharge can be estimated by calculating a product of the fixed value Z and the ratio W. It is preferable that the ratio W is the smallest one of the ratios obtained in the experiments to have less risk of the lack of electricity.

Figure 17:
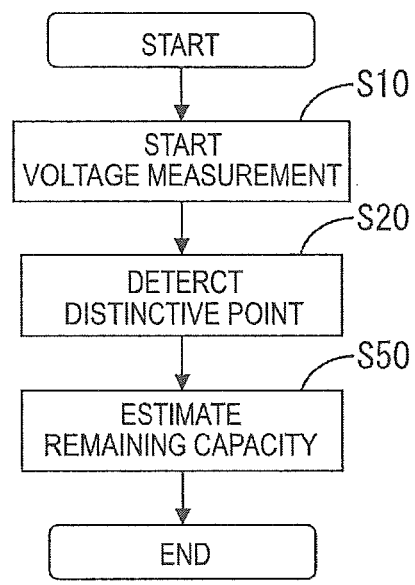
FIG. 17 is a brief flowchart of a remaining capacity estimation sequence.
Figure 18:
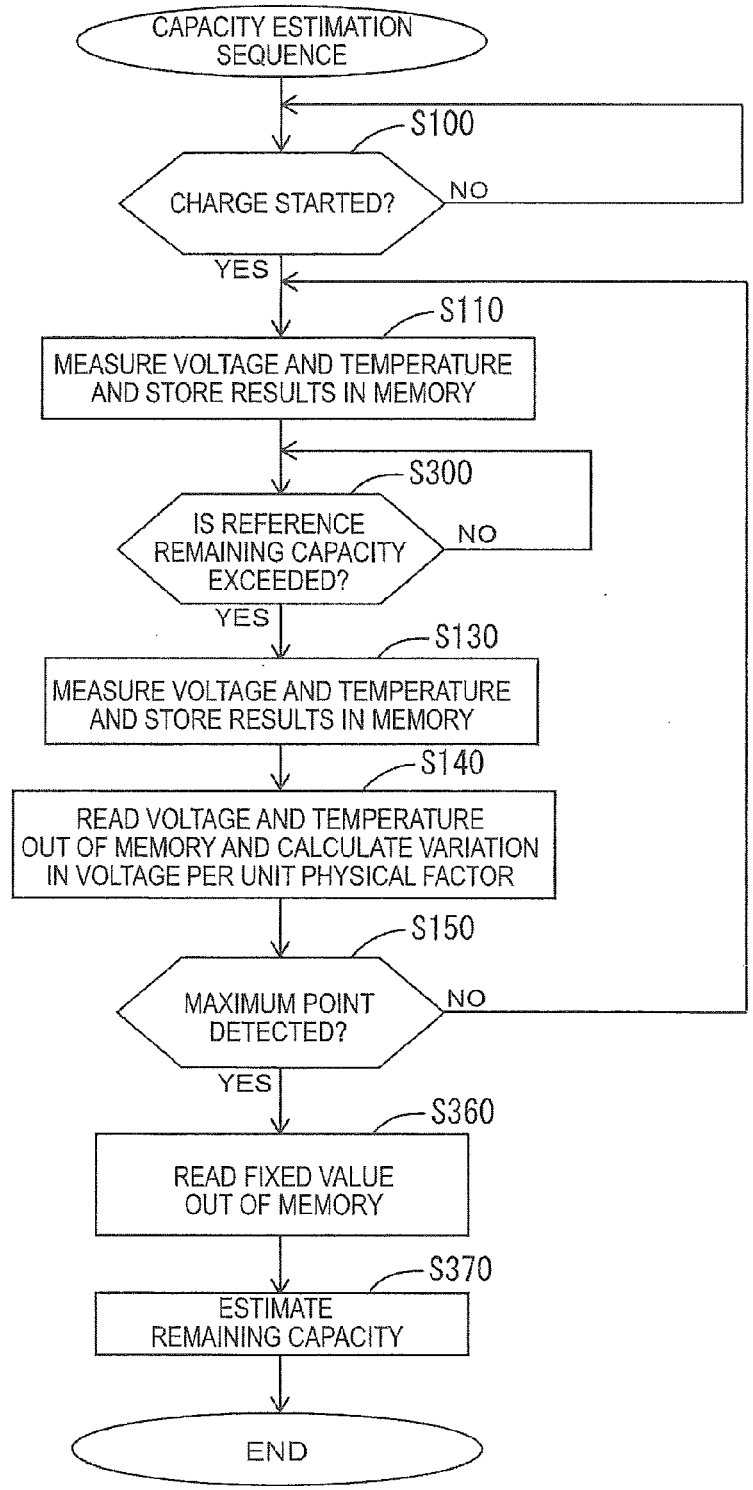
FIG. 18 is a detailed flowchart of the remaining capacity estimation sequence.

Next, a capacity estimation sequence for estimating the battery capacity X of the secondary battery 14 will be described with reference to FIG. 17 and FIG. 18. The capacity estimation sequence is executed by the CPU 70 in the BM 62 during the charge of the secondary battery 14.

Specifically, the CPU 70 determines whether the charge of the secondary battery 14 by the charger of the charger/load 18 is started (S100). If the charge by the charger 18 is not started (NO in step S100), the CPU 70 waits until the charge is started. If the charge by the charger 18 is started (YES in step S100), the CPU 70 controls the CS 20 to start measurement of a voltage V and measurement of a temperature D (S10, S110) of the secondary battery 14. The measurement of the voltage V and that of the temperature D of the secondary battery 14 are repeatedly performed in a predetermined cycle by the CS 20. The CPU 70 controls the CS 20 to transmit information including the measured voltage V and the measured temperature D together with information including the remaining capacity to the BM 62 via the communication line 80. The CPU 70 converts the information including the voltage V (e.g., V3) and the temperature D transmitted to the BM 62 to digital data in the ADC 78, and stores the digital data with the information including the remaining capacity (e.g., z4) in the memory 76 (S110). Steps S100 and S110 in FIG. 18 correspond to the step for starting the voltage measurement (S10) in FIG. 17.

When the CPU 70 receives the information including the voltage V and the temperature D of the secondary battery 14 from the CS 20, the CPU 70 starts detection of the distinctive point P (S20). Specifically, the CPU 70 determines whether the remaining capacity (reference remaining capacity) to control the CS 20 for the next measurement of the voltage V and that of the temperature D of the secondary battery 14 has been exceeded after the CPU 70 has received the information including the voltage V and the temperature D of the secondary battery 14 from the CS 20 (S300). If the reference remaining capacity has not been exceeded (NO in step S300), the CPU 70 waits until the reference remaining capacity is exceeded. If the reference remaining capacity has been exceeded (YES in step S300), the CPU 70 controls the CS 20 to perform the measurement of the voltage V and that of the temperature D (S130). The CPU 70 converts the information including the voltage V (e.g., V4) and the temperature D transmitted to the BM 62 to digital data in the ADC 78, and stores the digital data with the information including the remaining capacity (e.g., z4) in the memory 76 (S130).

The CPU 70 reads the data on the voltages V of the secondary battery 14 and data on a measurement data on the remaining capacity z at the voltage V (e.g., z3 and z4) out of the memory 76 to calculate the variation ΔV at each remaining capacity z (see Equation 2 below) (S140). Then, the CPU 70 compares the variations ΔV at the remaining capacities z to determine if each variation ΔV is a local maximum value (S150). If the variation ΔV is not the local maximum value (NO in step S150), the process returns to the step S110. If the variation ΔV is the local maximum value (YES in step S150), the CPU 70 detects the second distinctive point P2 that is the local maximum value in the high voltage region and the remaining capacity at which the second distinctive point P2 appears according to the above-described method (determination based on the startup voltage Vo) (S160). Step S20 corresponds to a distinctive point detection process and a step for detecting a distinctive point. Steps 120 to 150 in FIG. 18 correspond to the step for detecting the distinctive point (S20) in FIG. 17.

$$\Delta V = (V4 - V3)/(z4 - z3) \quad (2)$$

Then, the CPU 70 reads the fixed value Z out of the memory 76 (S360) and estimates the remaining capacity of the secondary battery 14 (S370). Steps 360 to 370 in FIG. 18 correspond to the step for estimating the remaining capacity (S50) in FIG. 17.

In the BM 62 according to this embodiment, the CPU 70 estimates the remaining capacity at which the second distinctive point P2 appears as the remaining capacity of the secondary battery 14. In this configuration, the CPU 70 can estimate the remaining capacity of the secondary battery 14 having the battery capacity X that is unknown. As a result, the CPU 70 can estimate the battery capacity more frequently, because requirements for the estimation of the remaining capacity are reduced.

Other Embodiments

The present invention is not limited to the embodiment described above and illustrated in the drawings. The following various embodiments are also included in the technical scope of the present invention.

(1) The lithium-ion secondary battery is used as an example of an electric storage device in the above first to fourth embodiments. However, the electric storage device is not limited to the lithium-ion secondary battery. The electric storage device may be secondary batteries other than the lithium-ion battery, or capacitors that exhibit electrochemical phenomenon.

(2) In the above second embodiment, the battery capacity X of the secondary battery 14 is estimated based on the measurement of the voltage during the charge of the secondary battery 14. However, the battery capacity X of the secondary battery 14 may be estimated based on the measurement of the voltage during the discharge of the secondary battery 14. Specifically, the distinctive point P or the period T may be detected based on the variations ΔV during the discharge or based on the voltage V during the discharge. Information regarding time such as a measurement time, which is used for the measurement of the period T, may be provided by an external device. The variation ΔV may be a variation in voltage per unit remaining capacity.

(3) In the above first to fourth embodiments, the charger of the charger/load 18 is a constant current/constant voltage charger. However, the charger 18 may be a constant power/constant voltage charger.

(4) In the above first to fourth embodiments, the CPU 70 is used as an example of a controller. The controller may include a plurality of CPUs, a hardware circuit such as an application specific integrated circuit (ASIC), or both of the hardware circuit and the CPU. Namely, the controller can have any configuration as long as the capacity estimation sequence is executed through software processing or using a hardware circuit.

(5) In the first embodiment, the battery capacity X of the secondary battery 14 is estimated based on the correlation data (FIG. 4) that contains the voltages V at which the second distinctive points P2 appear in association with the battery capacities X of the secondary batteries 14.

As will be described later, the voltage V at which the second distinctive point P2 appears differs depending on the ambient temperature although the secondary batteries 14 have the same capacity X. The voltage V tends to be smaller as the ambient temperature decreases. Therefore, it is preferable that the correlation data that contains the voltages V at which the second distinctive points P2 appear in association with the battery capacities X of the secondary batteries 14 (the correlation data in FIG. 14) is prepared for different ambient temperatures.

Figure 19:
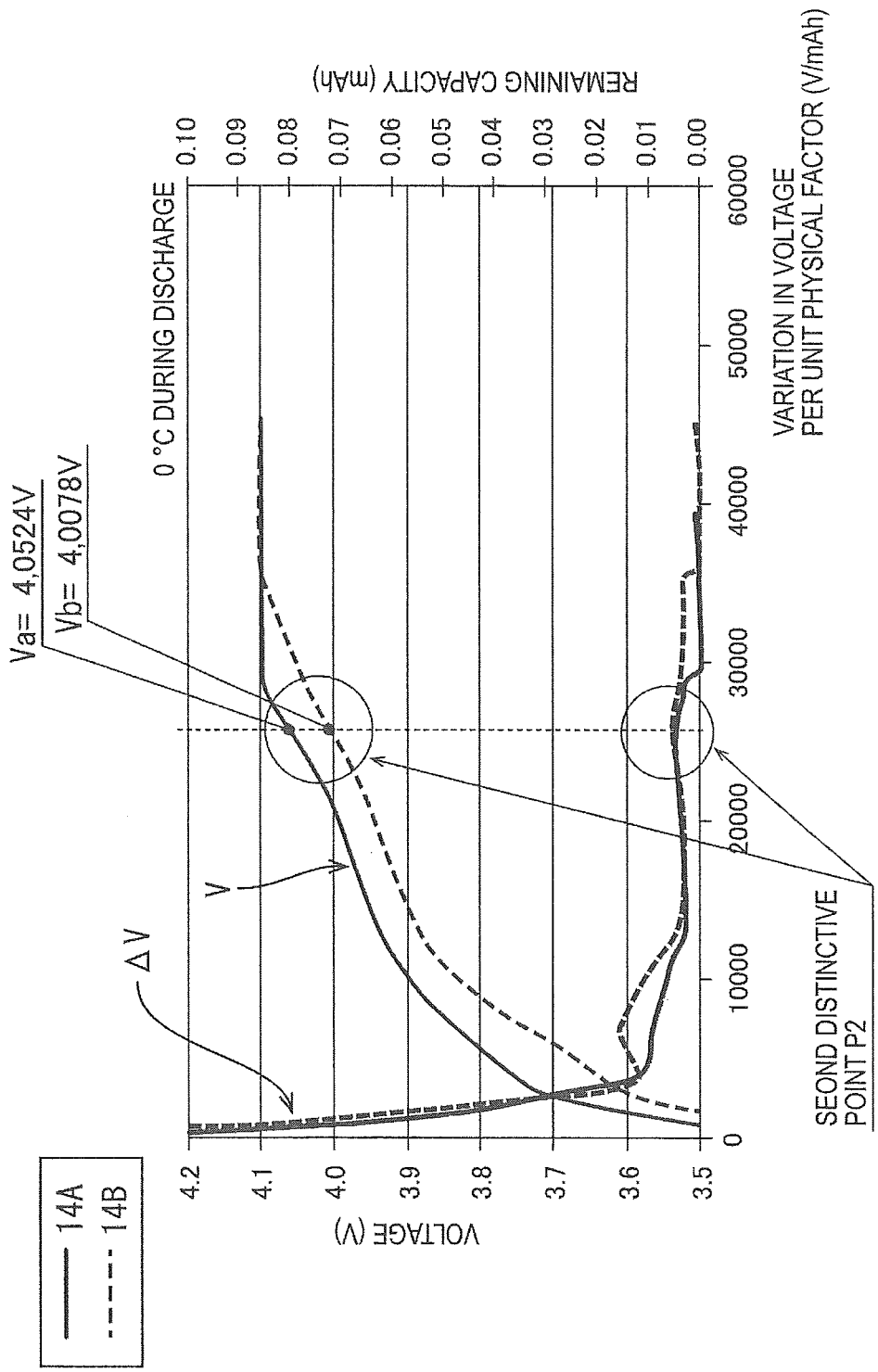
FIG. 19 a graph illustrating variations in voltage, variations in voltage per unit remaining capacity or per unit time, and variations in charge current of a secondary battery during discharge at an ambient temperature of 0° C. according to an embodiment.

In FIG. 19, variations in voltage V and variations in voltage per unit remaining capacity ΔV during discharge of the secondary batteries, which is the same secondary batteries as the secondary batteries 14A, 14B in FIG. 3, from the SOC of 100(%) at the rate of 0.2 (CA) under an ambient temperature of 0° C. are represented. As illustrated in FIG. 3, under the ambient temperature of 25° C., the second distinctive point P2 appears at the voltage V of 4.0577 (V) in the secondary battery 14A and at the voltage V of 4.0119 (V) in the secondary battery 14B. As illustrated in FIG. 19, under the ambient temperature of 0° C., the second distinctive point P2 appears at the voltage V of 4.0524 (V) in the secondary battery 14A and at the voltage V of 4.0078 (V) in the secondary battery 14B. As can be seen from this, the voltages V at which the second distinctive points P2 appear in the batteries differ from one another depending on the ambient temperature although the secondary batteries have the same battery capacity X. The voltage V tends to be smaller as the ambient temperature decreases. The same tendency is exhibited during the discharge and the charge. Therefore, it is preferable that the correlation data that contains the voltages V at which the second distinctive points P2 appear in association with the battery capacities X of the secondary batteries 14 (the correlation data in FIG. 14) is prepared for different ambient temperatures.

(6) In the second embodiment, the battery capacity X of the secondary battery 14 is estimated based on the correlation data (FIG. 14) that contains the periods T in association with the battery capacities X of the secondary batteries 14. As illustrated in FIG. 20, the correlation data is prepared for different ambient temperatures. The period T from when the distinctive point P appears until when the voltage of the secondary battery 14 reaches the set voltage is affected by internal resistance r of the secondary battery 14. A value of the internal resistance r changes depending on the ambient temperature. If the correlation data is prepared for different ambient temperatures as described above, the battery deterioration level (capacity retention rate) can be correctly estimated. In the secondary batteries 14 that have the same capacity retention rate, the period T becomes shorter as the ambient temperature decreases. This is based on the following.

$$V = E + r \times I \quad (3)$$

where V is a terminal voltage of the secondary battery 14, E is an open voltage of the secondary battery 14, r is an internal resistance of the secondary battery, and I is a charge current of the secondary battery 14.

The internal resistance r of the secondary battery 14 differs depending on the ambient temperature. The internal resistance r of the secondary battery 14 becomes larger as the ambient temperature decreases. In the secondary batteries 14 that have the same capacity retention rate (i.e., the same deterioration level), the internal resistance r becomes larger as the ambient temperature decreases. On the other hand, the open circuit voltage E of the secondary battery 14 is constant without being affected by the ambient temperature. The terminal voltage V of the secondary battery 14 becomes higher as the ambient temperature decreases. Therefore, the voltage at which the distinctive point P appears becomes higher as the ambient temperature decreases. The difference between the set voltage for estimating the battery capacity X and the voltage V at which the distinctive point P appears becomes smaller as the ambient temperature decreases. Therefore, the period T becomes shorter as the ambient temperature decreases.

(7) In the first embodiment, the "battery capacity" X of the secondary battery 14 is described as an example of the "condition" of the electric storage device, and the battery capacity X of the secondary battery 14 is estimated based on the voltage V at which the distinctive point P appears. The "condition" of the electric storage device is not limited to the battery capacity X of the secondary battery 14, but may be the "internal resistance" r of the secondary battery 14. The battery capacity (deterioration level) X of the secondary battery 14 is correlated with the internal resistance r of the secondary battery 14, and thus the internal resistance r of the secondary battery 14 is correlated with the voltage V at which the distinctive point P appears. Therefore, the internal resistance r of the secondary battery 14 can be estimated based on the voltage V at which the distinctive point P appears. Specifically, experiments may be conducted for measuring voltages V of the secondary batteries 14 having different internal resistances r (having the same initial capacity) at which the distinctive points P appear. Then, correlation data that contains the voltages V at which the distinctive points P appear in association with the internal resistances r of the secondary batteries 14 (similar to the data in FIG. 4) may be created. The internal resistance r of the secondary battery 14 can be estimated by the voltage at which the distinctive point P appears based on the correlation data. In addition, correlation data that contains the periods T in association with the internal resistances r of the secondary battery 14 (similar to the data in FIG. 4) may be created. The internal resistance r of the secondary battery 14 can be estimated by the period T based on the correlation data.

(8) In the first embodiment, the second distinctive point P2 is detected based on the startup voltage Vo, but may be detected by other methods based on other factors than the startup voltage Vo. For example, the distinctive point P that is detected at a time close to the time at which the secondary battery 14 reaches the set voltage (4.1 V in this embodiment) may be detected as the distinctive point, which is used for measuring the period. The voltage at which the distinctive point P is detected may be compared with the range of the voltage at which the second distinctive point P2 appears to determine whether the distinctive point P is the second distinctive point P2. It is preferable to detect the distinctive point P by a plurality of methods to detect the second distinctive point P2 with higher accuracy.

(9) In the first to fourth embodiments, the battery pack 60 is installed in an electric vehicle or a hybrid vehicle. However, the application of the present technology is not limited to an electric vehicle (EV) or a hybrid vehicle (HV). The present technology may be applied to any apparatus or system in which an electric storage device such as the secondary battery 14 is installed. For example, the present technology may be applied to a train or a plug-in electric hybrid vehicle (PHEV). In addition, the present technology may be applied to an energy system having an electric storage function such as a home energy management system (HEMS). Other than the condition estimation device, the embodiments described herein can be used in various applications including a method of estimating a condition of an electric storage device such as the secondary battery 14, a computer program for executing the function of the device or the method, and a recording medium that stores the computer program.

(10) In the fourth embodiment, the remaining capacity at which the second distinctive point P2 appears is set as the fixed value Z, and the fixed value Z is determined as the remaining capacity of the secondary battery 14. However, as described with reference to FIG. 19, the voltages V at which the second distinctive points P2 appear in the secondary batteries 14 differ from one another depending on the ambient temperature although the secondary batteries 14 have the same battery capacity X. The voltage V at which the second distinctive point P2 appears becomes lower as the ambient temperature decreases. The same tendency is applied to the remaining capacity at which the second distinctive point P2 appears (during the discharge, the voltage V at which the second distinctive point P2 appears becomes higher as the ambient temperature decreases). Therefore, different pieces of the correlation data that contains the remaining capacities of the secondary batteries 14 at which the second distinctive points P2 appear in association with the ambient temperatures may be prepared for different ambient temperatures.

(11) In the fourth embodiment, the fixed value Z is the smallest one of the remaining capacities obtained in the above experiments to have less risk of the lack of electricity. However, the present technology is not limited thereto. The fixed value Z may be the largest one of the remaining capacities obtained in the above experiments or may be a mean value of the remaining capacities.

(12) In the fourth embodiment, the ratio W is the smallest one of the ratios obtained in the experiment to have less risk of the lack of electricity. However, the present technology is not limited thereto. The ratio W may be the largest one of the ratios obtained in the experiment or a mean value of the ratios.

The invention claimed is:

1. A condition estimation device for estimating a condition of an electric storage device, the condition estimation device comprising:
    a voltage detector configured to detect a voltage of the electric storage device; and
    a controller configured to perform:
        a distinctive point detection process to detect a distinctive point based on the voltage detected by the voltage detector, the distinctive point being a point at which a variation in voltage per unit remaining capacity or per unit time of the electric storage device during charge or discharge is a local maximum value; and
        an estimation process to estimate the condition of the electric storage device based on the distinctive point detected in the distinctive point detection process.

2. The condition estimation device according to claim 1, wherein the controller is further configured to perform the estimation process to estimate the condition of the electric storage device based on the voltage of the electric storage device at which the distinctive point appears.

3. The condition estimation device according to claim 1, wherein the controller is further configured to perform the estimation process to estimate a remaining capacity of the electric storage device based on the distinctive point detected in the distinctive point detection process.

4. The condition estimation device according to claim 1, wherein the distinctive point includes a plurality of distinctive points, and
    wherein the controller is configured to select one of the distinctive points in a higher voltage region in the distinctive point detection process.

5. The condition estimation device according to claim 1, wherein the controller is further configured to:
    perform a period measurement process to measure a period from when the distinctive point detected in the distinctive point detection process appears until when a voltage of the electric storage device reaches a set voltage, and
    perform the estimation process to estimate the condition of the electric storage device based on the period measured in the period measurement process.

6. The condition estimation device according to claim 5, wherein the controller is further configured to detect whether the voltage of the electric storage device reaches the set voltage based on the voltage of the electric storage device detected by the voltage detector.

7. The condition estimation device according to claim 5, wherein the set voltage includes a switching voltage at which a charge mode for charging the electric storage device is switched.

8. The condition estimation device according to claim 1, wherein the controller is further configured to perform the distinctive point detection process to determine the distinctive point based on the variation in voltage per unit remaining capacity or per unit time of the electric storage device during the charge.

9. The condition estimation device according to claim 1, wherein the electric storage device includes a negative active material including graphite.

10. The condition estimation device according to claim 1, wherein the controller is further configured to perform a deterioration estimating process to estimate a deterioration level of the electric storage device.

11. A condition estimation method for estimating a condition of an electric storage device, the method comprising:
    detecting a distinctive point based on a voltage of the electric storage device detected by a voltage detector, the distinctive point being a point at which a variation in voltage per unit remaining capacity or per unit time of the electric storage device during charge or discharge is a local maximum value; and
    estimating the condition of the electric storage device based on the distinctive point.

12. The condition estimation method according to claim 11, wherein the distinctive point comprises the point at which the variation in voltage per the unit remaining capacity during the charge or the discharge is the local maximum value.

13. The condition estimation method according to claim 11, wherein the distinctive point comprises the point at which the variation in voltage per the unit time of the electric storage device during the charge or the discharge is the local maximum value.

14. The condition estimation method according to claim 11, further comprising:
    estimating the condition of the electric storage device based on a voltage of the electric storage device at which the distinctive point appears.

15. The condition estimation method according to claim 11, further comprising:
    estimating a remaining capacity of the electric storage device based on the detected distinctive point.

16. The condition estimation method according to claim 11, wherein the distinctive point includes a plurality of distinctive points, and
    wherein the method further comprises selecting one of the distinctive points in a higher voltage region in the detecting the distinctive point.

17. The condition estimation method according to claim 11, further comprising:
    measuring a period from when the detected distinctive point appears until when the voltage of the electric storage device reaches a set voltage.

18. The condition estimation method according to claim 17, further comprising:
    estimating the condition of the electric storage device based on the period measured in the measuring the period.

19. The condition estimation device according to claim 1, wherein the distinctive point comprises the point at which the variation in voltage per the unit remaining capacity during the charge or the discharge is the local maximum value.

20. The condition estimation device according to claim 1, wherein the distinctive point comprises the point at which the variation in voltage per the unit time of the electric storage device during the charge or the discharge is the local maximum value.

* * * * *